US010308512B2

(12) United States Patent
Tanner et al.

(10) Patent No.: US 10,308,512 B2
(45) Date of Patent: Jun. 4, 2019

(54) MICROWAVE REACTOR SYSTEM WITH GAS-SOLIDS SEPARATION

(71) Applicant: Lyten, Inc., Sunnyvale, CA (US)

(72) Inventors: David Tanner, San Jose, CA (US); Daniel Cook, Woodside, CA (US); Bryce H. Anzelmo, Mountain View, CA (US); Ranjeeth Kalluri, Fremont, CA (US); Michael W. Stowell, Sunnyvale, CA (US)

(73) Assignee: Lyten, Inc., Sunnyvale, CA (US)

( * ) Notice: Subject to any disclaimer, the term of this patent is extended or adjusted under 35 U.S.C. 154(b) by 0 days.

(21) Appl. No.: 15/725,928

(22) Filed: Oct. 5, 2017

(65) Prior Publication Data

US 2018/0099871 A1 Apr. 12, 2018

Related U.S. Application Data

(60) Provisional application No. 62/406,745, filed on Oct. 11, 2016, provisional application No. 62/404,851, filed on Oct. 6, 2016.

(51) Int. Cl.
*B01J 8/00* (2006.01)
*B01D 46/00* (2006.01)
(Continued)

(52) U.S. Cl.
CPC .......... *C01B 32/05* (2017.08); *B01J 8/0055* (2013.01); *B01J 19/126* (2013.01);
(Continued)

(58) Field of Classification Search
CPC . C01B 32/05; B01J 19/126; B01J 2219/1209; B01J 2219/1269;
(Continued)

(56) References Cited

U.S. PATENT DOCUMENTS

| 5,211,923 A | 5/1993 | Harkness et al. |
| 5,693,173 A | 12/1997 | Colombo et al. |

(Continued)

FOREIGN PATENT DOCUMENTS

| CN | 105870419 A | 8/2016 |
| CN | 106398802 A | 2/2017 |

(Continued)

OTHER PUBLICATIONS

Notice of Allowance dated Mar. 16, 2018 for U.S. Appl. No. 15/711,620.

(Continued)

*Primary Examiner* — Nicholas A Smith
*Assistant Examiner* — Colleen M Raphael
(74) *Attorney, Agent, or Firm* — MLO, a professional corp.

(57) ABSTRACT

Microwave chemical processing system having a microwave plasma reactor, and a multi-stage gas-solid separation system are disclosed. The microwave energy source has a waveguide, a reaction zone, and an inlet configured to receive the input material, and the input material is converted into separated components. The separated components include hydrogen gas and carbon particles. The multi-stage gas-solid separation system has a first cyclone separator to filter the carbon particles from the separated components, and a back-pulse filter system coupled to the output of the first cycle separator to filter the carbon particles from the output from the first cyclone separator.

20 Claims, 19 Drawing Sheets

(51) Int. Cl.
  *B01J 19/12* (2006.01)
  *C01B 32/05* (2017.01)
  *H01J 37/32* (2006.01)
(52) U.S. Cl.
  CPC .. *H01J 37/32192* (2013.01); *H01J 37/32229* (2013.01); *B01D 46/00* (2013.01); *B01J 2219/0886* (2013.01); *B01J 2219/0894* (2013.01); *B01J 2219/1209* (2013.01); *B01J 2219/1248* (2013.01); *B01J 2219/1269* (2013.01); *B01J 2219/1296* (2013.01); *C01P 2004/61* (2013.01)
(58) Field of Classification Search
  CPC .............. B01J 2219/1248; B01J 8/0055; B01J 2219/0894; B01J 2219/0886; B01D 46/00; C01P 2004/61
  See application file for complete search history.

(56) References Cited

U.S. PATENT DOCUMENTS

| | | | |
|---|---|---|---|
| 6,120,741 A * | 9/2000 | Jacquault | B01J 19/126 422/199 |
| 6,156,114 A * | 12/2000 | Bell | B01J 8/0015 264/437 |
| 6,383,301 B1 * | 5/2002 | Bell | B01J 8/0015 118/716 |
| 8,636,960 B2 | 1/2014 | Spitzl et al. | |
| 8,968,588 B2 | 3/2015 | Zhao et al. | |
| 9,862,602 B1 | 1/2018 | Riso et al. | |
| 9,862,606 B1 | 1/2018 | Cook et al. | |
| 2002/0050323 A1 | 5/2002 | Moisan et al. | |
| 2003/0024806 A1 | 2/2003 | Foret | |
| 2003/0086859 A1 | 5/2003 | Kawakami et al. | |
| 2004/0245088 A1 | 12/2004 | Gardner | |
| 2004/0261617 A1 | 12/2004 | Stewart | |
| 2005/0089684 A1 | 4/2005 | Barron et al. | |
| 2005/0123467 A1 | 6/2005 | Harutyunyan | |
| 2005/0163696 A1 | 7/2005 | Uhm et al. | |
| 2007/0212254 A1 | 9/2007 | Nagatsu | |
| 2007/0274893 A1 | 11/2007 | Wright et al. | |
| 2008/0029030 A1 | 2/2008 | Goto et al. | |
| 2009/0060805 A1 | 3/2009 | Muradov et al. | |
| 2009/0194528 A1 * | 8/2009 | Kotzian | B01J 19/126 219/690 |
| 2010/0056819 A1 | 3/2010 | Jang et al. | |
| 2011/0036014 A1 | 2/2011 | Tsangaris et al. | |
| 2011/0059006 A1 | 3/2011 | Donnet et al. | |
| 2011/0206946 A1 | 8/2011 | Schmidt et al. | |
| 2012/0034137 A1 | 2/2012 | Risby | |
| 2012/0058397 A1 | 3/2012 | Zhamu et al. | |
| 2012/0094175 A1 | 4/2012 | Sheem et al. | |
| 2013/0136684 A1 | 5/2013 | Wu et al. | |
| 2013/0150516 A1 | 6/2013 | Lettow | |
| 2013/0248773 A1 | 9/2013 | Chang et al. | |
| 2013/0270110 A1 | 10/2013 | Sasai et al. | |
| 2013/0296479 A1 | 11/2013 | Martin et al. | |
| 2013/0310495 A1 | 11/2013 | Kim et al. | |
| 2014/0030181 A1 | 1/2014 | Liu et al. | |
| 2014/0159572 A1 | 6/2014 | Risby et al. | |
| 2014/0251955 A1 | 9/2014 | Itoh et al. | |
| 2014/0313636 A1 | 10/2014 | Tour et al. | |
| 2015/0044565 A1 | 2/2015 | Wang et al. | |
| 2015/0073072 A1 | 3/2015 | Kim et al. | |
| 2015/0179294 A1 | 6/2015 | Kim et al. | |
| 2015/0246813 A1 | 9/2015 | Koveal et al. | |
| 2015/0267063 A1 | 9/2015 | Drewer et al. | |
| 2016/0059197 A1 | 3/2016 | Stevanovic et al. | |
| 2016/0185603 A1 | 6/2016 | Bozalina et al. | |
| 2016/0243518 A1 | 8/2016 | Spitzl | |
| 2016/0340495 A1 | 11/2016 | Pan et al. | |
| 2017/0113935 A1 | 4/2017 | Pennington et al. | |
| 2017/0174520 A1 | 6/2017 | Walters et al. | |
| 2018/0099871 A1 | 4/2018 | Tanner et al. | |
| 2018/0327611 A1 | 11/2018 | Scheffer et al. | |

FOREIGN PATENT DOCUMENTS

| | | | |
|---|---|---|---|
| JP | 2001122690 A | | 5/2001 |
| JP | 2004346385 A | | 12/2004 |
| KR | 100583500 B1 | | 5/2006 |
| WO | 2000014518 A1 | | 3/2000 |
| WO | 2010094969 A1 | | 8/2010 |
| WO | 2014090992 A3 | | 8/2014 |
| WO | 2015189643 A1 | | 12/2015 |
| WO | 2016001476 A1 | | 1/2016 |
| WO | 2016126599 A1 | | 8/2016 |
| WO | 2016135328 A1 | | 9/2016 |

OTHER PUBLICATIONS

International Search Report and Written Opinion dated Feb. 9, 2018 for PCT Application No. PCT/US2017/057892.
International Search Report dated Jan. 24, 2018 for PCT Patent Application Nu. PCT/US/2017/055337.
Office Action dated Nov. 29, 2017 for U.S. Appl. No. 15/711,620.
International Search Report dated Aug. 23, 2018 for PCT Patent Application Nu. PCT/US2018/015674.
International Search Report dated Jul. 9, 2018 for PCT Patent Application Nu. PCT/US2018/022420.
International Search Report dated Jun. 25, 2018 for PCT Patent Application Nu. PCT/US2018/022072.
International Search Report dated Jun. 27, 2018 for PCT Patent Application Nu. PCT/US2018/015671.
International Search Report dated Jun. 28, 2018 for PCT Patent Application Nu. PCT/US2018/020963.
Notice of Allowance dated Jun. 29, 2018 for U.S. Appl. No. 15/794,965.
Office Action dated Jun. 26, 2018 for U.S. Appl. No. 15/727,533.
Baldissarelli, Vanessa et al., "Plasma-Assisted Production of Carbon Black and Carbon Nanotubes from Methane by Thermal Plasma Reform," J. Braz., Chem. Soc., vol. 25, No. 1, 126-132, 2014, pub. online: Nov. 26, 2011.
Final Office Action dated Mar. 21, 2019 for U.S. Appl. No. 15/918,422.
Non-Final Office Action dated Mar. 21, 2019 for U.S. Appl. No. 15/710,679.

* cited by examiner

MICROWAVE REACTOR SYSTEM WITH GAS-SOLIDS SEPARATION

RELATED APPLICATIONS

This application claims priority to: 1) U.S. Provisional Patent Application No. 62/404,851, filed on Oct. 6, 2016 and entitled "Microwave Reactor System"; and 2) U.S. Provisional Patent Application No. 62/406,745, filed on Oct. 11, 2016 and entitled "Bio-Gas System"; all of which are hereby incorporated by reference.

BACKGROUND

Microwave plasmas are used in the industrial chemical processing of gases. This is typically accomplished by flowing the gases to be reacted through an elongated vessel while microwave energy is coupled into the vessel to generate a plasma. The plasma cracks the gas molecules into component species. Microwave chemical processing systems are effective because microwave plasmas operate at relatively high power coupling efficiencies at low ion energies, and are capable of supporting various gas reactions, such as the conversion of methane into hydrogen and carbon particulates, the conversion of carbon dioxide into oxygen and carbon, and coating particulates and other seed materials with other layers for functionalization and complex layered materials and aggregates processing.

Typical systems for chemical gas processing include a quartz reaction chamber through which process materials flow, and a microwave magnetron source coupled to the reaction chamber through a waveguide. The input microwave energy can be continuous wave or pulsed. Systems are designed to control the effective coupling of the microwave energy into the reaction chamber, and the gas flow within the reaction chamber to improve the energy absorption by the flowing gas. Often the systems include a wedge located where the microwave waveguide intersects the quartz reaction chamber, to concentrate the electric field within a small area, and the waveguide conductive walls are not exposed to the gases to be processed.

In microwave chemical processing systems that produce gases and particulates, the particulate filtration is accomplished using a gas-solids separation system. The gas-solids separation systems can contain cyclone filters, back-pulse filters, or other filters. For example, filtering the carbon-containing particles from the hydrogen gas that are generated in microwave chemical processing systems is challenging. In some cases, the generated carbon-containing particles are very small (e.g., median particle size below 100 nm), which exacerbates the particle filtration challenges. Some gas-solids separation systems for separating carbon-containing particles from a gas stream use back-pulse filters. In some cases, the back-pulse filters employ heated filters (e.g., heated filter candles). In some of these systems, the back-pulse filters are periodically cleared by blowing gas through the filter candles to dislodge carbon-containing particles (i.e., using a back-pulse that flows gas in the opposite direction the from the filtration direction). Other gas-solids separation systems for separating carbon-containing particles from hydrogen gas use cyclone separators. In some cases, the cyclone separators are also heated.

SUMMARY

In some embodiments, a materials processing system includes an input material comprising a hydrocarbon gas; a microwave plasma reactor; and a multi-stage gas-solid separator system coupled to the microwave plasma reactor. In some embodiments, the microwave plasma reactor includes a microwave energy source; a waveguide; a reaction zone, where the microwave energy source is coupled to the reaction zone through the waveguide, and the microwave energy generates a plasma in the reaction zone; and an inlet configured to receive the input material, where the input material flows through the inlet into the reaction zone. The plasma separates the input material into separated components, the separated components comprising hydrogen gas and carbon particles. In some embodiments, the multi-stage gas-solid separator system includes a first cyclone separator having an output, where the first cyclone separator filters the carbon particles from the separated components; and a back-pulse filter system coupled to the output of the first cycle separator, where the back-pulse filter system filters the carbon particles from the output from the first cyclone separator.

In some embodiments, a process for producing carbon particles includes providing an input material comprising a hydrocarbon gas; processing the input material into separate components using a microwave plasma reactor, where the separated components contain hydrogen gas and carbon particles; and filtering the carbon particles from the hydrogen gas using a multi-stage gas-solid separator system. In some embodiments, the multi-stage gas-solid separator system includes a first cyclone separator having an output; and a back-pulse filter system, where the first cyclone separator filters the carbon particles from the separated components; and the back-pulse filter system filters the carbon particles from the output from the first cyclone separator.

DETAILED DESCRIPTION

Figure 1A:
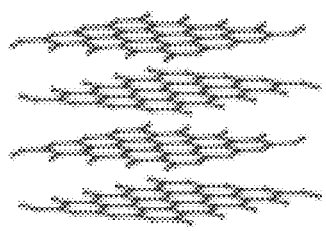
FIGS. 1A-1D are schematics of carbon allotropes as known in the art.

Microwave plasma chemical processing systems use microwave energy to create a plasma, and the plasma is used to convert an input material into separated components. In some cases, the separated components include a mixture of solid particles and gaseous products. In such systems, the microwave plasma chemical reactor can be designed to produce gases and particles with desirable properties (e.g., product gas species, product gas purity, particle composition and crystal structure, particle size, surface area, mass density, electrical conductivity, etc.) from a particular input material. The input material properties (e.g., input material species, input material purity, etc.) can also affect the properties of the separated components (e.g., product gas species, product gas purity, particle composition and crystal structure, particle size, surface area, mass density, electrical conductivity, etc.). Additionally, in microwave plasma chemical processing systems that produce mixtures of solid particles and gaseous products, the gas-solids separation system is critical. Gas-solids separation systems that effectively filter a large fraction of the produced particles and are cost-effective can be challenging to produce.

Throughout this disclosure the terms "process material," "input material," and "precursor material" all refer to the material being converted into separated components in the microwave plasma chemical processing system. In some embodiments, the input material is a "process gas."

The microwave plasma chemical processing systems and methods described in this disclosure enable cost-effective production of solid particles and gaseous products from various input materials. The microwave plasma chemical reactors and microwave plasma materials processing methods described herein enable high production rates of solid particles and gaseous products with desirable properties. The gas-solids separation systems and methods described herein enable cost-effective filtration of the solid particles from the gaseous products. The gas-solids separation systems described herein can also impact the properties of the solid particles and gaseous products that are produced.

In some embodiments, a materials processing system includes: an input material comprising a hydrocarbon gas, a microwave plasma reactor, and a multi-stage gas-solid separator system coupled to the microwave plasma reactor. In some embodiments, the microwave plasma reactor includes: a microwave energy source, a waveguide having a reaction zone, where the microwave energy source is coupled to the reaction zone through the waveguide, and the microwave energy generates a plasma in the reaction zone. In some embodiments, the microwave plasma reactor also includes an inlet configured to receive the input material, where the input material flows through the inlet into the reaction zone, and the plasma separates the input material into separated components (e.g., hydrogen gas and carbon particles).

In some embodiments, the input materials can be gases, liquids or colloidal dispersions. In microwave plasma chemical processing reactors of various embodiments, the processing of the input materials into separated components occurs in a reaction zone of a waveguide. In this disclosure, embodiments may be described using one type of input material, such as gases, as an example material, but the embodiments may be equally applicable to other types of materials, such as liquids and/or colloidal dispersions.

In some embodiments, the input material (e.g., a process material) is a gas. In some embodiments, the input material is a hydrocarbon gas, such as $C_2H_2$, $C_2H_4$, $C_2H_6$. In some embodiments, the input material is an industrial gas such as natural gas, or bio-gas. In some embodiments, the input material is a mixture of natural gas and hydrogen gas, or a mixture of bio-gas a hydrogen gas. In some embodiments, the process material is methane, ethane, ethylene, acetylene, propane, propylene, butane, butylenes, or butadiene, and the separated components are hydrogen and nanoparticulate carbon. In some embodiments, the process material is carbon dioxide with water, and the separated components are oxygen, carbon and water. In some embodiments, the process material is $H_2S$, and the separated components are hydrogen gas and sulfur. In some embodiments, the input material does not contain carbon dioxide, or has less than 1% carbon dioxide, or less than 0.1% carbon dioxide, or less than 0.01% carbon dioxide. In some embodiments, the input material does not contain oxygen, or has less than 1% oxygen, or less than 0.1% oxygen, or less than 0.01% oxygen. In some embodiments, the process material does not contain water, or has less than 1% water, or less than 0.1% water, or less than 0.01% water. In some embodiments, the process material is a complex gas-based material, for example $SiH_4$, trimethylaluminum (TMA), trimethylgallium (TMG), glycidyl methacrylate (GMA), $SF_6$, and other materials used in the semiconductor industry for the deposition and etching of metals and dielectrics.

In some embodiments, the separated products include hydrogen gas, and the hydrogen gas is used in applications such as in refineries, ammonia synthesis, methanol synthesis, metallurgical reduction processes, or the hydrogenation of fatty acids.

In some embodiments, the input material is a gas that is produced in industrial processes, such as natural gas, or bio-gas. In some cases, the input material can be a byproduct of an industrial process.

Natural gas (NG) input material generally contains methane, and ethane. NG can also contain other hydrocarbons such as propane, butane and pentane. NG can also contain other species in lower concentrations such as nitrogen and carbon dioxide. In general, the composition of species in natural gas varies by source. In some embodiments, NG contains methane, up to 10 mol % ethane, up to 5 mol % propane, up to 2 mol % butane, up to 4 mol % nitrogen, and up to 4 mol % carbon dioxide. As an example of one particular region, Northern California NG contains 86.6 wt. % methane, 5.86 wt. % ethane, 3.5 wt. % propane, 1.51 wt. % butane, 2.5 wt. % carbon dioxide, and a concentration of nitrogen below the experimental detection limit.

Bio-gas input material generally contains methane, carbon dioxide, nitrogen, water, and other species. In general, the composition of species in bio-gas varies by source. For example, bio-gas can contain approximately 65% to 70% methane, 25% to 30% carbon dioxide, 0% to 5% nitrogen, 0% to 5% water, 0% to 5% hydrogen sulfide, and less than 1% oxygen. In other embodiments, the composition of the bio-gas can be outside of these ranges, and other species can be included. In some embodiments, the bio-gas input material is pre-treated prior to conversion in the microwave plasma reactors to remove one or more constituent species, such as carbon dioxide, hydrogen sulfide, water, and/or oxygen.

In some embodiments, the flow rate of the input material into the reactor is from 1 slm (standard liters per minute) to 1000 slm, or from 2 slm to 1000 slm, or from 5 slm to 1000 slm, or greater than 1 slm, or greater than 2 slm, or greater than 5 slm.

In some embodiments, the separated components contain hydrogen gas and carbon particles, and the solids loading, in mass of solids per volume of gas, is greater than 0.001 g/L, or is greater than 0.01 g/L, or is greater than 0.05 g/L, or greater than 0.1 g/L, or greater than 0.15 g/L, or greater than 0.2 g/L, or greater than 0.25 g/L, or greater than 1 g/L, or greater than 2 g/L, or greater than 5 g/L, or from 0.001 g/L to 5 g/L, or from 0.001 g/L to 2.5 g/L, or from 0.001 g/L to 1 g/L, or from 0.001 g/L to 0.5 g/L, or from 0.001 g/L to 0.1 g/L, or from 0.01 g/L to 5 g/L, or from 0.01 g/L to 2.5 g/L, or from 0.01 g/L to 1 g/L, or from 0.01 g/L to 0.5 g/L, or from 0.01 g/L to 0.4 g/L, or from 0.01 g/L to 0.3 g/L, or from 0.01 g/L to 0.2 g/L, or from 0.01 g/L to 0.1 g/L, or from 0.1 g/L to 5 g/L, or from 0.1 g/L to 2.5 g/L, or from 0.1 g/L to 1 g/L, or from 0.1 g/L to 0.5 g/L, or from 0.1 g/L to 0.4 g/L, or from 0.1 g/L to 0.3 g/L, or from 0.1 g/L to 0.2 g/L.

In some embodiments, where the separated components include solid particles and gaseous products, the multi-stage gas-solid separator system includes one or more cyclone separators, and a fines filter system. In some cases, the one or more cyclone separators filter the carbon particles from the separated components, and the fines filter system is coupled to the output of the first cyclone separator, such that the fines filter system filters the carbon particles from the output from the cyclone separators. Some examples of fines filters are filters utilizing porous media to capture particles (e.g., pressure filters, vacuum filters, back-pulse filters, etc.), filters utilizing liquids to capture particles (e.g., distillation columns, liquid vortex filters, etc.), and filters utilizing electrostatic forces to capture particles (e.g., electrostatic precipitation filters).

In some embodiments, where the separated components include solid particles and gaseous products, the multi-stage gas-solid separator system includes one or more cyclone separators, and a back-pulse filter system. In some cases, the one or more cyclone separators filter the carbon particles from the separated components, and the back-pulse filter system is coupled to the output of the first cyclone separator, such that the back-pulse filter system filters the carbon particles from the output from the cyclone separators. In some embodiments, the temperature of gas-solids separation systems (e.g., the cyclone separators and back-pulse filter system) can also be elevated to prevent gaseous species from condensing on the filters and the produced particles. In some embodiments, the gaseous products are purified after the gas-solids separation system and prior to storage. Although the present embodiments shall be described as using a back-pulse filter, other types of fines filters may apply to the embodiments.

Carbon Allotropes Produced Using Microwave Chemical Processing Systems

In some embodiments, microwave chemical processing systems produce carbon nanoparticles and aggregates, such as the materials described in U.S. patent application Ser. No. 15/594,032, entitled "Carbon Allotropes," and in U.S. patent application Ser. No. 15/711,620 entitled "Seedless Particles With Carbon Allotropes," which are assigned to the same assignee as the present application, and are incorporated herein by reference as if fully set forth herein for all purposes. Additional information and embodiments for microwave plasma gas processing system methods and apparatuses to produce the carbon nanoparticles and aggregates described herein are also described in the aforementioned U.S. patent applications.

In general, the input material and process conditions within the microwave plasma reactor and gas-solids separation system will affect the properties of the carbon particles and agglomerates produced. In some embodiments, the particles and agglomerates include different allotropes of (i.e., various forms of) carbon, including graphite, graphene, fullerenes, amorphous carbon and combinations thereof, as described below. In some embodiments, the carbon nanoparticles and aggregates are characterized by a high degree of order (i.e., low concentration of defects), and/or high purity (i.e., low concentration of elemental impurities), in contrast to the less ordered and lower purity particles achievable with conventional systems and methods.

The form-factors of the materials described herein are particles (e.g., nanoparticles or aggregates). The form-factors are not films, which are arranged on objects or substrates. In some embodiments, the carbon particles described herein are core-less or seedless (i.e., do not contain a core or a seed of a material other than carbon). In some embodiments, the carbon aggregates described herein are characterized by a size that is substantially larger than comparable prior art particles.

In contrast to particles created via conventional systems and methods, the seedless carbon nanoparticles and aggregates described herein have low concentration of elemental impurities, and have large particles sizes, high surface areas and high electrical conductivities as-synthesized. In some embodiments, the carbon nanoparticles and aggregates described herein are produced and filtered using relatively high speed, low cost, improved microwave chemical processing systems and methods, as described herein.

In the present disclosure, the term "graphene" refers to an allotrope of carbon in the form of a two-dimensional, atomic-scale, hexagonal lattice in which one atom forms each vertex. The carbon atoms in graphene are $sp^2$-bonded. Additionally, graphene has a Raman spectrum with three main peaks: a G-mode at approximately 1580 $cm^{-1}$, a D-mode at approximately 1350 $cm^{-1}$, and a 2D-mode peak at approximately 2690 $cm^{-1}$ (when using a 532 nm excitation laser). In the present disclosure, a single layer of graphene is a single sheet of hexagonally arranged (i.e., $sp^2$-bonded) carbon atoms. It is known that the ratio of the intensity of the 2D-mode peak to the G-mode peak (i.e., the 2D/G intensity ratio) is related to the number of layers in the graphene. A higher 2D/G intensity ratio corresponds to fewer layers in multilayer graphene materials. In different embodiments of the present disclosure, graphene contains fewer than 15 layers of carbon atoms, or fewer than 10 layers of carbon atoms, or fewer than 7 layers of carbon atoms, or fewer than 5 layers of carbon atoms, or fewer than 3 layers of carbon atoms, or contains a single layer of carbon atoms, or contains from 1 to 10 layers of carbon atoms, or contains from 1 to 7 layers of carbon atoms, or contains from 1 to 5 layers of carbon atoms. In some embodiments, few layer graphene (FLG) contains from 2 to 7 layers of carbon atoms. In some embodiments, many layer graphene (MLG) contains from 7 to 15 layers of carbon atoms.

In the present disclosure, the term "graphite" refers to an allotrope of carbon in the form of a two-dimensional, atomic-scale, hexagonal lattice in which one atom forms each vertex. The carbon atoms in graphite are sp$^2$-bonded. Additionally, graphite has a Raman spectrum with two main peaks: a G-mode at approximately 1580 cm$^{-1}$ and a D-mode at approximately 1350 cm$^{-1}$ (when using a 532 nm excitation laser). Similar to graphene, graphite contains layers of hexagonally arranged (i.e., sp$^2$-bonded) carbon atoms. In different embodiments of the present disclosure, graphite can contain greater than 15 layers of carbon atoms, or greater than 10 layers of carbon atoms, or greater than 7 layers of carbon atoms, or greater than 5 layers of carbon atoms, or greater than 3 layers of carbon atoms.

In the present disclosure, the term "fullerene" refers to a molecule of carbon in the form of a hollow sphere, ellipsoid, tube, or other shapes. Spherical fullerenes can also be referred to as Buckminsterfullerenes, or buckyballs. Cylindrical fullerenes can also be referred to as carbon nanotubes. Fullerenes are similar in structure to graphite, which is composed of stacked graphene sheets of linked hexagonal rings. Fullerenes may also contain pentagonal (or sometimes heptagonal) rings.

In the present disclosure, the term "multi-walled fullerene" refers to fullerenes with multiple concentric layers. For example, multi-walled nanotubes (MWNTs) contain multiple rolled layers (concentric tubes) of graphene. Multi-walled spherical fullerenes (MWSFs) contain multiple concentric spheres of fullerenes.

In the present disclosure, the term "amorphous carbon" refers to a carbon allotrope that has minimal or no crystalline structure. One method for characterizing amorphous carbon is through the ratio of sp$^2$ to sp$^3$ hybridized bonds present in the material. The sp$^2$ to sp$^3$ ratios can be determined by comparing the relative intensities of various spectroscopic peaks (including EELS, XPS, and Raman spectroscopy) to those expected for carbon allotropes with sp$^2$ or sp$^3$ hybridization.

In the present disclosure, the term "nanoparticle" refers to a particle that has a size from 1 nm to 900 nm. The nanoparticle can include one or more type of structure (e.g., crystal structure, defect concentration, etc.), and one or more type of atom. The nanoparticle can be any shape, including but not limited to spherical shapes, spheroidal shapes, dumbbell shapes, cylindrical shapes, elongated cylindrical type shapes, rectangular prism shapes, disk shapes, wire shapes, irregular shapes, dense shapes (i.e., with few voids), porous shapes (i.e., with many voids), etc. In the present disclosure, the term "particle" refers to a particle that has any size, including nanoparticles.

In the present disclosure, the term "aggregate" refers to a plurality of particles or nanoparticles that are connected together by Van der Waals forces, by covalent bonds, by ionic bonds, by metallic bonds, or by other physical or chemical interactions. Aggregates can vary in size considerably, but in general are larger than about 500 nm.

Throughout this application, the terms "particle" or "particles" are generic terms that can include any size particles, including nanoparticles and aggregates.

The carbon particles and nanoparticles described herein contain graphite and graphene, with no seed particles. In some embodiments, the particles and nanoparticles described herein contain graphite containing greater than 15 layers of carbon atoms, or greater than 10 layers of carbon atoms, or greater than 7 layers of carbon atoms, or greater than 5 layers of carbon atoms, or greater than 3 layers of carbon atoms, and graphene containing fewer than 15 layers of carbon atoms, or fewer than 10 layers of carbon atoms, or fewer than 7 layers of carbon atoms, or fewer than 5 layers of carbon atoms, or fewer than 3 layers of carbon atoms, or contain a single layer of carbon atoms, or contain from 1 to 10 layers of carbon atoms, or contain from 1 to 7 layers of carbon atoms, or contain from 1 to 5 layers of carbon atoms, with no seed particles. In some embodiments, a plurality of the carbon particles or nanoparticles are contained within a carbon aggregate. In some embodiments, a carbon material contains a plurality of the carbon aggregates.

In some embodiments, the carbon particles or nanoparticles further comprise multi-walled spherical fullerenes (MWSFs). In some embodiments, the carbon particles or nanoparticles further comprise connected MWSFs, with layers of graphene coating the connected MWSFs. In some embodiments, the carbon particles or nanoparticles further comprise amorphous carbon.

In some embodiments, the particles and aggregates described herein contain a mixture of graphene and a second allotrope of carbon, and do not contain a seed particle. In some embodiments, the second allotrope of carbon is graphite, MWSFs, connected MWSFs, or amorphous carbon. In some embodiments, the particles and aggregates contain a mixture of graphene, a second allotrope of carbon, and a third allotrope of carbon, and do not contain a seed particle. In some embodiments, the second allotrope is graphite and the third allotrope is MWSFs, connected MWSFs, or amorphous carbon.

Figure 1B:
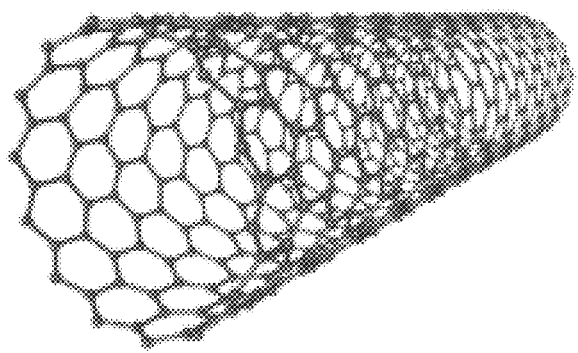
Figure 1C:
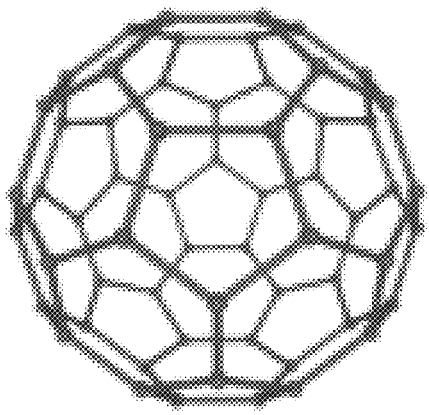
Figure 1D:
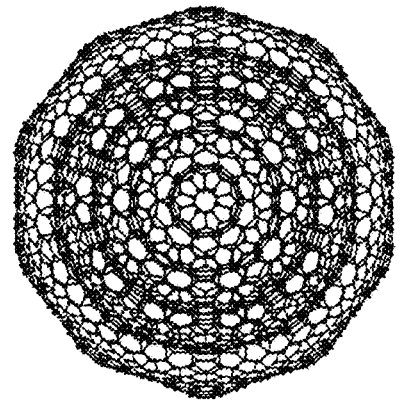

In some embodiments, the particles and aggregates described herein contain higher-order carbon allotropes. Some examples of conventional idealized higher-order carbon allotropes are shown in FIGS. 1A-1D. FIG. 1A shows a schematic of graphite, where carbon forms multiple layers of a two-dimensional, atomic-scale, hexagonal lattice in which one atom forms each vertex. Graphite is made of single layers of graphene. FIG. 1B shows a schematic of a carbon nanotube, where carbon atoms form a hexagonal lattice that is curved into a cylinder. Carbon nanotubes can also be referred to as cylindrical fullerenes. FIG. 1C shows a schematic of a C60 buckminsterfullerene, where a single layer of a hexagonal lattice of carbon atoms forms a sphere. Other spherical fullerenes exist that contain single layers of hexagonal lattices of carbon atoms, and can contain 60 atoms, 70 atoms, or more than 70 atoms. FIG. 1D shows a schematic of a carbon nano-onion from U.S. Pat. No. 6,599,492, which contains multiple concentric layers of spherical fullerenes.

Figure 1E:
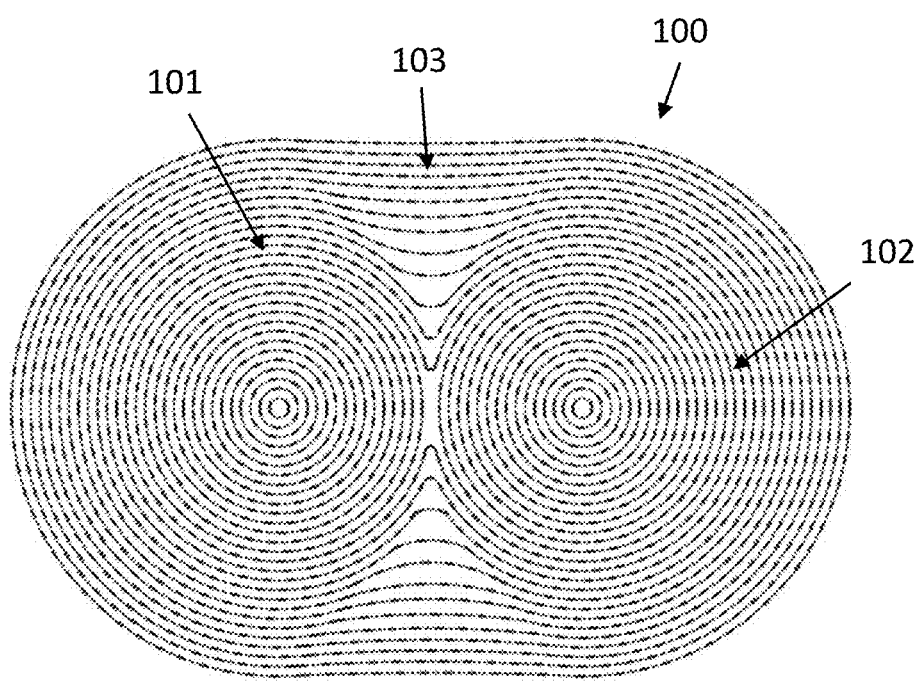
FIG. 1E is a schematic of idealized connected multi-walled spherical fullerenes, in accordance with some embodiments.

In some embodiments, the carbon nanoparticles and aggregates described herein are characterized by a well-ordered structure with high purity as illustrated by an idealized carbon nanoparticle 100 shown in FIG. 1E. The carbon allotrope in FIG. 1E contains two connected multi-walled spherical fullerenes (MWSFs) 101 and 102 with layers of graphene 103 coating the connected MWSFs 101 and 102. The allotrope shown in FIG. 1E is also core-less (i.e., does not contain a core of a material other than carbon at the center of the spherical fullerene). The idealized nanoparticle shown in FIG. 1E has high uniformity since the ratio of MWSFs to graphene is high, is well-ordered since there are no point defects (e.g., missing carbon atoms) and no distorted carbon lattices, and has a high purity since there are no elements (e.g., a core of impurities) other than carbon, in contrast with low uniformity mixtures of MWSFs mixed with other carbon allotropes, poorly-ordered MWSFs with many point defects and distorted lattices, and low purity MWSFs (e.g., with seed particles at the core). In other embodiments, the connected MWSFs do contain a core. In some embodiments, the core is a void, or a carbon-based material that is not an MWSF (e.g., amorphous carbon), or a seed that is not carbon-based.

In some embodiments, the aggregates described herein contain graphene (e.g., containing up to 15 layers) and one or more other carbon allotropes in addition to graphene, and have a ratio of graphene to other carbon allotropes from 20% to 80%, a high degree of order (e.g., a Raman signature with the ratio of the intensity of the 2D-mode peak to the G-mode peak greater than 0.5), and a high purity (e.g., the ratio of carbon to other elements, other than H, is greater than 99.9%). In some embodiments, the ratio of graphene to other carbon allotropes is from 5% to 95%, or from 10% to 90%, or from 10% to 80% or from 10% to 60%, or from 10% to 40%, or from 10% to 20%, or from 20% to 40%, or from 20% to 90%, or from 40% to 90%, or from 60% to 90%, or from 80% to 90%, or greater than 5%, or greater than 10%, or greater than 20%, or greater than 30%, or greater than 40%, or greater than 50%, or greater than 60%, or greater than 70%, or greater than 80%, or greater than 90%. In some embodiments, the particles produced using the methods described herein contain graphite and other carbon allotropes, and do not contain a core composed of impurity elements other than carbon. In some cases, the aggregates of the particles have large diameters (e.g., greater than 10 microns across).

In some embodiments, the aggregates described herein contain graphene (e.g., containing up to 15 layers) and graphite (e.g., containing greater than 15 layers) and have a ratio of graphene to graphite from 20% to 80%, a high degree of order (e.g., a Raman signature with the ratio of the intensity of the 2D-mode peak to the G-mode peak greater than 0.5), and a high purity (e.g., the ratio of carbon to other elements, other than H, is greater than 99.9%). In some embodiments, the ratio graphene to graphite is from 5% to 95%, or from 10% to 90%, or from 10% to 80% or from 10% to 60%, or from 10% to 40%, or from 10% to 20%, or from 20% to 40%, or from 20% to 90%, or from 40% to 90%, or from 60% to 90%, or from 80% to 90%, or greater than 5%, or greater than 10%, or greater than 20%, or greater than 30%, or greater than 40%, or greater than 50%, or greater than 60%, or greater than 70%, or greater than 80%, or greater than 90%. In some embodiments, the particles produced using the methods described herein contain graphite and graphene, and do not contain a core composed of impurity elements other than carbon. In some cases, the aggregates of the particles have large diameters (e.g., greater than 10 microns across).

In some embodiments, the aggregates described herein contain graphene, MWSFs or connected MWSFs, and optionally graphite, and have a ratio of graphene to MWSF from 20% to 80%, a high degree of order (e.g., a Raman signature with ratio of the intensities of the D-mode peak to G-mode peak from 0.95 to 1.05), and a high purity (e.g., the ratio of carbon to other elements, other than H, is greater than 99.9%). In some embodiments, the ratio of graphene to MWSFs or connected MWSFs is from 5% to 95%, or from 10% to 90%, or from 10% to 80% or from 10% to 60%, or from 10% to 40%, or from 10% to 20%, or from 20% to 40%, or from 20% to 90%, or from 40% to 90%, or from 60% to 90%, or from 80% to 90%, or greater than 5%, or greater than 10%, or greater than 20%, or greater than 30%, or greater than 40%, or greater than 50%, or greater than 60%, or greater than 70%, or greater than 80%, or greater than 90%. In some embodiments, the particles produced using the methods described herein contain MWSFs or connected MWSFs, and the MWSFs do not contain a core composed of impurity elements other than carbon. In some cases, the aggregates of the particles have large diameters (e.g., greater than 10 microns across).

In some embodiments, the aggregates described herein contain graphene, amorphous carbon, and optionally graphite, and have a ratio of graphene to amorphous carbon from 1% to 10%, and have a high purity (e.g., the ratio of carbon to other elements, other than H, is greater than 99.9%). In some embodiments, the ratio of graphene to amorphous carbon is from 5% to 95%, or from 1% to 90%, or from 1% to 80%, or from 1% to 60%, or from 1% to 40%, or from 1% to 20%, 10% to 90%, or from 10% to 80% or from 10% to 60%, or from 10% to 40%, or from 10% to 20%, or from 20% to 40%, or from 20% to 90%, or from 40% to 90%, or from 60% to 90%, or from 80% to 90%, or greater than 5%, or greater than 10%, or greater than 20%, or greater than 30%, or greater than 40%, or greater than 50%, or greater than 60%, or greater than 70%, or greater than 80%, or greater than 90%. In some embodiments, the particles produced using the methods described herein contain amorphous carbon, and do not contain a core composed of impurity elements other than carbon. In some cases, the aggregates of the particles have large diameters (e.g., greater than 10 microns across).

In some embodiments, the carbon material has a ratio of carbon to other elements, except hydrogen, greater than 60%, or greater than 70%, or greater than 80%, or greater than 90%, or greater than 99%, or greater than 99.5%, or greater than 99.7%, or greater than 99.9%, or greater than 99.95%.

In some embodiments, the median size of the carbon aggregates is from 1 micron to 50 microns, or from 2 microns to 20 microns, or from 5 microns to 40 microns, or from 5 microns to 30 microns, or from 10 microns to 30 microns, or from 10 microns to 25 microns, or from 10 microns to 20 microns. In some embodiments, the size distribution of the carbon aggregates has a $10^{th}$ percentile from 1 micron to 10 microns, or from 1 micron to 5 microns, or from 2 microns to 6 microns, or from 2 microns to 5 microns. The size of the particles that make up the aggregates can vary in size, and can be smaller than 10 nm or up to hundreds of nanometers in size. In some embodiments, the nanoparticles that make up the aggregates have an average diameter in a range from 5 to 500 nm, or from 5 to 250 nm, or from 5 to 100 nm, or from 5 to 50 nm, or from 10 to 500 nm, or from 10 to 250 nm, or from 10 to 100 nm, or from 10 to 50 nm, or from 40 to 500 nm, or from 40 to 250 nm, or from 40 to 100 nm, or from 50 to 500 nm, or from 50 to 250 nm, or from 50 to 100 nm. In some embodiments, the size of aggregates is measured using TEM images. In some embodiments, the size of the aggregates is measured using a laser particle size analyzer (e.g., a Fritsch Analysette 22 MicroTec plus).

In some embodiments, the surface area of the carbon aggregates, when measured using the Brunauer-Emmett-Teller (BET) method with nitrogen as the adsorbate (i.e., the "BET method using nitrogen", or the "nitrogen BET method") or the Density Functional Theory (DFT) method, is from 50 to 300 $m^2/g$, or from 100 to 300 $m^2/g$, or from 50 to 200 $m^2/g$, or from 50 to 150 $m^2/g$, or from 60 to 110 $m^2/g$, or from 50 to 100 $m^2/g$, or from 70 to 100 $m^2/g$. In some embodiments, a carbon aggregate containing MWSFs or connected MWSFs, as defined above, has high specific surface area. In some embodiments, the carbon aggregate has a BET specific surface area from 10 to 300 $m^2/g$, or from 10 to 200 $m^2/g$, or from 10 to 100 $m^2/g$, or from 10 to 50 $m^2/g$, or from 50 to 500 $m^2/g$, or from 100 to 200 $m^2/g$, or from 100 to 300 $m^2/g$, or from 100 to 1000 $m^2/g$.

In some embodiments, the density of the carbon aggregates as-synthesized (i.e., upon exiting the microwave plasma reactor) is less than 0.1 g/cm$^3$, or less than 0.5 g/cm$^3$, or less than 0.25 g/cm$^3$, or less than 0.2 g/cm$^3$, or less than 0.1 g/cm$^3$, or less than 0.05 g/cm$^3$, or from 0.01 g/cm$^3$ to 1 g/cm$^3$, or from 0.01 g/cm$^3$ to 0.5 g/cm$^3$, or from 0.01 g/cm$^3$ to 0.25 g/cm$^3$, or from 0.01 g/cm$^3$ to 0.2 g/cm$^3$, or from 0.01 g/cm$^3$ to 0.1 g/cm$^3$, or from 0.01 g/cm$^3$ to 0.075 g/cm$^3$, or from 0.01 g/cm$^3$ to 0.05 g/cm$^3$.

In some embodiments, the carbon aggregates, when compressed (e.g., into a disk, pellet, etc.), and optionally annealed, have an electrical conductivity greater than 500 S/m, or greater than 1000 S/m, or greater than 2000 S/m, or from 500 S/m to 20,000 S/m, or from 500 S/m to 10,000 S/m, or from 500 S/m to 5000 S/m, or from 500 S/m to 4000 S/m, or from 500 S/m to 3000 S/m, or from 2000 S/m to 5000 S/m, or from 2000 S/m to 4000 S/m, or from 1000 S/m to 5000 S/m, or from 1000 S/m to 3000 S/m. In some cases, the density after compression is approximately 1 g/cm$^3$, or approximately 1.2 g/cm$^3$, or approximately 1.5 g/cm$^3$, or approximately 2 g/cm$^3$, or approximately 2.2 g/cm$^3$, or approximately 2.5 g/cm$^3$, or approximately 3 g/cm$^3$. In some cases, compression pressure of 2000 psi to 12000 psi are used, and the compressed material can be annealed at temperatures from 500° C. and 1500° C., or from 800° C. to 1000° C.

In some embodiments, a carbon aggregate containing MWSFs or connected MWSFs, as defined above, has high electrical conductivity. In some embodiments, a carbon aggregate containing MWSFs or connected MWSFs, as defined above, is compressed into a pellet and the pellet has electrical conductivity greater than 500 S/m, or greater than 1000 S/m, or greater than 2000 S/m, or greater than 3000 S/m, or greater than 4000 S/m, or greater than 5000 S/m, or greater than 10000 S/m, or greater than 20000 S/m, or greater than 30000 S/m, or greater than 40000 S/m, or greater than 50000 S/m, or greater than 60000 S/m, or greater than 70000 S/m, or from 500 S/m to 100000 S/m, or from 500 S/m to 1000 S/m, or from 500 S/m to 10000 S/m, or from 500 S/m to 20000 S/m, or from 500 S/m to 100000 S/m, or from 1000 S/m to 10000 S/m, or from 1000 S/m to 20000 S/m, or from 10000 to 100000 S/m, or from 10000 S/m to 80000 S/m, or from 500 S/m to 10000 S/m. In some cases, the density of the pellet is approximately 1 g/cm$^3$, or approximately 1.2 g/cm$^3$, or approximately 1.5 g/cm$^3$, or approximately 2 g/cm$^3$, or approximately 2.2 g/cm$^3$, or approximately 2.5 g/cm$^3$, or approximately 3 g/cm$^3$. Additionally, tests have been performed in which compressed pellets of the carbon aggregate materials have been formed with compressions of 2000 psi and 12000 psi and with annealing temperatures of 800° C. and 1000° C. The higher compression and/or the higher annealing temperatures generally resulted in pellets with higher electrical conductivity, including in a range of 10000 S/m to 15000 S/m.

The carbon nanoparticles and aggregates described herein are characterized by Raman spectroscopy to determine the species of carbon allotropes present, and their degree of order. The main peaks in the Raman spectra for graphite and graphene are the G-mode, the D-mode and the 2D-mode. The G-mode peak has a wave number of approximately 1580 cm$^{-1}$, and is attributed to the vibration of carbon atoms in sp$^2$-hybridized carbon networks. The D-mode peak has a wave number of approximately 1350 cm$^{-1}$, and can be related to the breathing of hexagonal carbon rings with defects. The 2D-mode peak is a second-order overtone of the D-mode and has a wave number of approximately 2690 cm$^{-1}$.

In some embodiments, the graphite- and graphene-containing carbon materials have a Raman spectrum (using 532 nm incident light) with a 2D-mode peak and a G-mode peak, and the 2D/G intensity ratio is greater than 0.2, or greater than 0.5, or greater than 1.

Raman spectroscopy can also be used to characterize the structure of MWSFs. When using 532 nm incident light, the Raman G-mode is typically at 1582 cm$^{-1}$ for planar graphite, but can be downshifted for MWSFs (e.g., to 1565-1580 cm$^{-1}$). The D-mode is observed at approximately 1350 cm$^{-1}$ in the Raman spectra of MWSFs. The ratio of the intensities of the D-mode peak to G-mode peak (i.e., the D/G intensity ratio) is related to the degree of order of the MWSFs, where a lower D/G intensity ratio indicates higher degree of order. A D/G intensity ratio near or below 1 indicates a relatively high degree of order, and a D/G intensity ratio greater than or equal to 1.2 indicates lower degree of order.

In some embodiments, a carbon nanoparticle or a carbon aggregate containing MWSFs or connected MWSFs, as described herein, has a Raman spectrum with a first Raman peak at about 1350 cm$^{-1}$ and a second Raman peak at about 1580 cm$^{-1}$, when using 532 nm incident light. In some embodiments, the ratio of an intensity of the first Raman peak to an intensity of the second Raman peak (i.e., the $I_D/I_G$, or the D/G intensity ratio) for the nanoparticles or the aggregates described herein is in a range from 0.95 to 1.05, or from 0.9 to 1.1, or from 0.8 to 1.2, or from 0.9 to 1.2, or from 0.8 to 1.1, or from 0.5 to 1.5, or less than 1.5, or less than 1.2, or less than 1.1, or less than 1, or less than 0.95, or less than 0.9, or less than 0.8. In some embodiments, the carbon materials containing the MWSFs have a Raman spectrum (using 532 nm incident light) with a D-mode peak and a G-mode peak, and the D/G intensity ratio is from 0.9 to 1.1, or less than about 1.2.

In some embodiments, the carbon materials containing amorphous carbon have a Raman spectrum (using 532 nm incident light) with a 2D-mode peak, a D-mode peak and a G-mode peak, and the D/G intensity ratio is greater than 0.5. In some embodiments, the Raman spectrum also has a low intensity 2D-mode peak. In some embodiments, the 2D-mode peak has an intensity less than approximately 30% of the G-mode peak intensity, or less than 20% of the G-mode peak intensity, or less than 10% of the G-mode peak intensity. In some embodiments, the Raman spectrum has a D-mode peak and G-mode peak with a shallow valley between them. In some embodiments, the minimum intensity of the shallow valley between the D-mode peak and the G-mode peak is greater than approximately 40% of the G-mode peak intensity, or greater than approximately 50% of the G-mode peak intensity, or greater than approximately 60% of the G-mode peak intensity.

One benefit of producing aggregates of carbon nanoparticles, particularly with diameters in the ranges described above, is that aggregates of particles greater than 10 microns are easier to collect than particles or aggregates of particles that are smaller than 500 nm. The ease of collection reduces the cost of manufacturing equipment used in the production of the carbon nanoparticles and increases the yield of the carbon nanoparticles. Additionally, particles greater than 10 microns in size pose fewer safety concerns compared to the risks of handling smaller nanoparticles, e.g., potential health and safety risks due to inhalation of the smaller nanoparticles. The lower health and safety risks, thus, further reduce the manufacturing cost.

Microwave Chemical Processing Systems

Figure 2A:
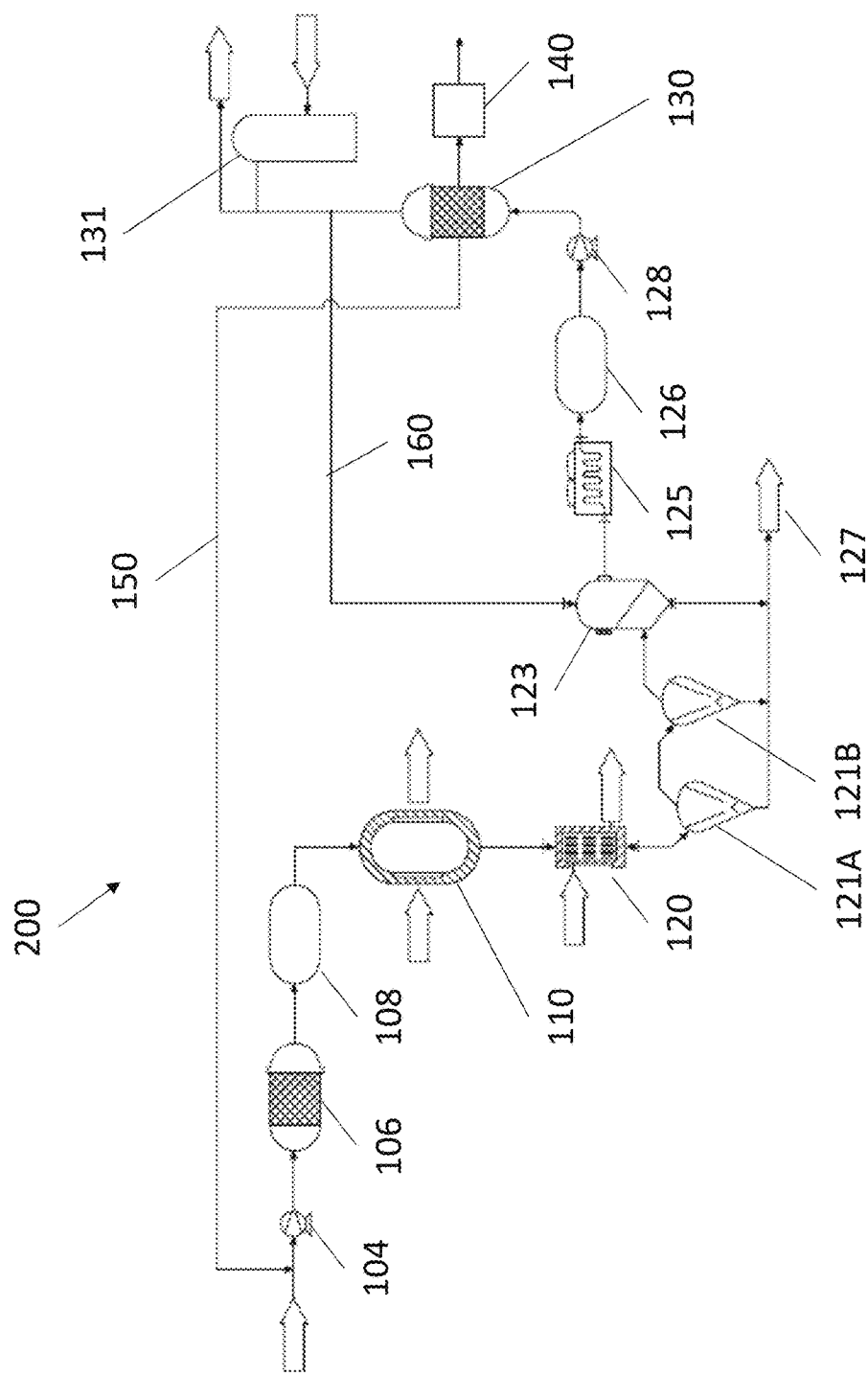
FIG. 2A is a schematic of a microwave chemical processing system, in accordance with some embodiments.

FIG. 2A shows a schematic of a microwave chemical processing system 200 in accordance with some embodiments. The non-limiting example system shown in FIG. 2A is designed to convert natural gas into hydrogen gas and carbon particle separated products. The incoming natural gas (NG) is first compressed using the natural gas compressor 104. Next, water is removed from the compressed NG using one or more NG driers 106. Next the dried NG is stored in the NG receiver 108 to accommodate any flow difference between the NG flow entering the microwave chemical processing system 200 and the flow that is provided to the microwave plasma reactors 110. After the NG is pre-treated by the compressor 104, drier 106 and receiver 108, it is converted into hydrogen gas and carbon particles in the one or more microwave plasma reactors 110. The hydrogen gas and carbon particles are next cooled using the effluent cooler (heat exchanger) 120, in preparation for the gas-solids separation. The cooled hydrogen gas and carbon particles enter a first cyclone separator 121A, and then a second cyclone separator 121B. After gas-solids separation by the cyclone separators, the hydrogen gas and carbon particles that have not been filtered out by the cyclone separators are further filtered by the back-pulse filter system 123. The back-pulse filter system 123 is also fed by a backpulse gas line 160 to enable the cleaning of the filter elements within the back-pulse filter system 123. The carbon particles filtered by the cyclone separators 121A and 121B and filter system 123 are transported to a supersack for storage at arrow 127. The hydrogen with the carbon particles filtered out is then further cooled in the dry cooler 125. The hydrogen gas is stored in the H2 accumulator 126 to accommodate any flow difference between the hydrogen gas flow exiting the dry cooler 125 and entering the subsequent system components, and then compressed in the H2 compressor 128, before being purified in the pressure swing absorber (PSA) 130. The purified hydrogen gas is sent to the H2 storage system 131, and the unpurified hydrogen that was rejected by the PSA 130 is sent to the flare 140 to be burned off.

The example system shown in FIG. 2A also includes a hydrogen recycling line 150. In this example, a hydrogen stream from the PSA 130 is routed back to the input of the compressor 104. Additionally, in this example system, the gas line 160 that supplies the back-pulse gas for cleaning the filter elements in the back-pulse filter system 123 is also provided from a hydrogen stream from the PSA 130.

In other embodiments, gases that are produced as separated components in the microwave chemical processing system can be recycled. For example, purified and/or unpurified hydrogen can be recycled from one location in the microwave chemical processing system to another location in the system. In some cases, the purified hydrogen from the PSA and/or unpurified hydrogen rejected by the PSA can be routed back to the microwave plasma reactor. The purified and/or unpurified hydrogen can be provided directly to the microwave plasma reactor, or it can be pre-treated (e.g., by a compressor, drier, or a purification system) before being provided to the microwave plasma reactor. In other cases, the purified hydrogen from the PSA and/or unpurified hydrogen rejected by the PSA can be routed back to the back-pulse filter to serve as the back-pulse gas.

The example system 200 shown in FIG. 2A has particular components chosen to facilitate the conversion of compressed NG into hydrogen gas and carbon particles. In some embodiments, systems for converting hydrocarbons (e.g., NG) into hydrogen and carbon particles may have additional components, or may omit one or more of the components shown in the system in FIG. 2A. In other embodiments, where there are different input materials and/or separated components, the systems can have different components. For example, in microwave chemical processing systems for the conversion of bio-gas into hydrogen gas and carbon particles, the bio-gas can be pre-treated before being converted into hydrogen gas and carbon particles in the microwave plasma reactors. There are different compositions and purities of bio-gas, and in some cases water, carbon dioxide, hydrogen sulfide and/or other components of the bio-gas can be removed prior to conversion in the microwave plasma reactors.

Several of the elements in the microwave chemical processing systems (similar to the example system shown in FIG. 2A) are described in greater detail below.

Microwave Chemical Processing Systems: Gas-Solid Separation Systems

In some embodiments, the multi-stage gas-solid separator system includes a first cyclone separator and a back-pulse filter system. In some cases, the first cyclone separator filters the carbon particles from the separated components, and the back-pulse filter system is coupled to the output of the first cyclone separator, such that the back-pulse filter system filters the carbon particles from the output from the first cyclone separator.

In some embodiments, the first cyclone separator is designed to filter out the largest particles, and the back-pulse filter system is designed to filter out smaller particles. For example, the size of the majority of the carbon particles filtered by the first cyclone separator can be greater than 1 micron, or greater than 2 microns, or greater than 5 microns, or greater than 10 microns, or greater than 20 microns, or from 500 nm to 50 microns, or from 1 to 30 microns, or from 1 to 20 microns, or from 1 to 10 microns; and the size of the majority of the carbon particles filtered by the back-pulse filter system are greater than 100 nm, or greater than 200 nm, or greater than 500 nm, or greater than 1 micron, or from 50 nm to 2 microns, or from 100 nm to 1 micron, or from 100 nm to 500 nm.

In some embodiments, the first cyclone separator is designed to filter out a first fraction of the particles produced in the microwave plasma reactor, and the back-pulse filter system is designed to filter out a second fraction of particles. For example, greater than 30%, or greater than 40%, or greater than 50%, or greater than 60%, or greater than 70%, or greater than 80%, or greater than 90%, or greater than 95%, or greater than 99%, of the carbon particles are filtered after the separated components are filtered by the first cyclone separator, and greater than 80%, or greater than 90%, or greater than 95%, or greater than 99%, or greater than 99.5%, or greater than 99.9% of the carbon particles are filtered after the separated components are filtered by the first cyclone separator and the back-pulse filter system.

In some cases, there is more than one cyclone separator upstream of the back-pulse filter system. For example, the multi-stage gas-solid separator system can contain a second cyclone separator between the first cyclone separator and the back-pulse filter system, where the first cyclone separator filters out a first fraction of the carbon particles in the separated components, the second cyclone separator filters out a second fraction of carbon particles in the separated components, and the back-pulse filter system filters out a third fraction of carbon particles in the separated components.

In some embodiments, the multi-stage gas-solid separation system contains multiple stages, where the first stage is designed to filter out the largest particles, and each subsequent stage is designed to filter out smaller particles than the preceding stage, such that the last stage is designed to filter out the smallest particles. For example, in the case of the gas-solids separation system containing a first cyclone separator, a second cyclone separator, and a back-pulse filter system, the particle sizes filtered by each stage can have various size ranges in various embodiments. For instance, in various embodiments the size of the majority of the carbon particles filtered by the first cyclone separator can be greater than 1 micron, or greater than 2 microns, or greater than 5 microns, or greater than 10 microns, or greater than 20 microns, or from 500 nm to 50 microns, or from 1 to 30 microns, or from 1 to 20 microns, or from 1 to 10 microns. Furthermore, the size of the majority of the carbon particles filtered by the second cyclone separator can be greater than 1 micron, or greater than 2 microns, or greater than 5 microns, or greater than 10 microns, or greater than 20 microns, or from 500 nm to 50 microns, or from 1 to 30 microns, or from 1 to 20 microns, or from 1 to 10 microns. And, the size of the majority of the carbon particles filtered by the back-pulse filter system are greater than 100 nm, or greater than 200 nm, or greater than 500 nm, or greater than 1 micron, or from 50 nm to 2 microns, or from 100 nm to 1 micron, or from 100 nm to 500 nm.

In some embodiments, the multi-stage gas-solid separation system contains multiple stages, where the first stage is designed to filter out a first fraction of the particles produced in the microwave plasma reactor, and each subsequent stage is designed to filter out a subsequent fraction of particles. For example, in the case of the gas-solids separation system containing a first cyclone separator, a second cyclone separator, and a back-pulse filter system, the fractions of particles filtered by each stage can have various size ranges in various embodiments. For instance, in various embodiments, greater than 30%, or greater than 40%, or greater than 50%, or greater than 60%, or greater than 70%, or greater than 80%, or greater than 90%, or greater than 95%, or greater than 99%, of the carbon particles are filtered after the separated components are filtered by the first cyclone separator. Furthermore, greater than 30%, or greater than 40%, or greater than 50%, or greater than 60%, or greater than 70%, or greater than 80%, or greater than 90%, or greater than 95%, or greater than 99%, of the carbon particles are filtered after the separated components are filtered by the first cyclone separator and the second cyclone separator. And, greater than 80%, or greater than 90%, or greater than 95%, or greater than 99%, or greater than 99.5%, or greater than 99.9% of the carbon particles are filtered after the separated components are filtered by the first cyclone separator, the second cyclone separator, and the back-pulse filter system.

In some embodiments, a microwave chemical processing system contains multiple microwave plasma reactors and/or multiple gas-solid separation systems. In such cases, each microwave plasma reactor can be coupled to an individual gas-solid separation system, or a single microwave plasma reactor can be coupled to multiple gas-solid separation systems, or multiple microwave plasma reactors can be coupled to a single gas-solid separation system. There can be advantages to different configurations in different embodiments. For example, in situations where the production rate of separated components from each microwave plasma reactor is high, it can be cost-effective to filter the separated products from each reactor in an individual gas-solid separation system. On the other hand, in situations where the production rate of the separated components from each microwave plasma reactor is low, it can be cost-effective to combine the flows from multiple microwave plasma reactors into an individual gas-solid separation system.

Typically, the temperatures in microwave chemical processing systems are high (e.g., greater than 500° C.), and as such, tend to generate products that are hot when exiting the reactor. In microwave chemical processing systems that produce hot solid particles and hot gases, the temperature of gas-solids separation systems (e.g., filters) can also be elevated to prevent gaseous species from condensing on the filters and the produced particles. For example, microwave chemical processing systems that produce carbon-containing particles and hydrogen gas from hydrocarbon input materials, also typically produce various reaction by-products including hydrocarbons. In some embodiments, the hydrocarbon by-products boiling points are from approximately 80° C. to approximately 400° C., or greater than 80° C., or greater than 300° C. In some embodiments, the temperature of the gas-solid separation system can be tuned to produce captured particles with a desired concentration of hydrocarbons adsorbed on the captured particles. For example, the concentration by mass of adsorbed hydrocarbons can be from 1% to 20%, or from 1% to 10%, or from 1% to 5%, or from 0.1% to 20%, or from 0.1% to 10%, or from 0.1% to 5%, or from 0.1% to 1%, or from 0.01% to 20%, or from 0.01% to 10%, or from 0.01% to 5%, or from 0.01% to 1%, or from 0.01% to 0.1%.

In some embodiments, the gas-solid separation system is heated. In some cases, the one or more cyclone separators and back-pulse filter systems contained in the gas-solids separation systems are heated to a temperature from 100° C. to 600° C., or from 200° C. to 500° C., or from 300° C. to 500° C., or greater than 300° C., or greater than 400° C., or greater than 500° C.

In some embodiments, the gas-solids separation system additionally contains one or more heat exchangers. In some embodiments, a first heat exchanger is located between the output of the microwave reactor output, and the first cyclone separator input (e.g., between reactor 110 and cyclone separator 121A of FIG. 2A). This first heat exchanger can be used to cool the products from the microwave plasma reactor to a temperature suitable to filtration in the cyclone separators. For example, the output products from the microwave plasma reactor can have a temperature from 500° C. to 1500° C., and the cyclone separators and back-pulse filter system in the gas-solids separation system can operate at temperatures from 200° C. to 400° C. In such an example, a first heat exchanger can be used to cool the output products before entering the first cyclone separator in the gas-solids separation system.

In some embodiments, a second heat exchanger can be used to cool the gas exiting the last particle filtration stage in the gas-solids separation system (e.g., after back-pulse filter 123 of FIG. 2A). In some cases, the gas will be cooled by this second heat exchanger to be accumulated, compressed, purified further, and/or stored.

The gas-solids separation systems described herein overcome shortcomings of conventional systems. The gas-solids separation systems described herein enable a high fraction of microwave plasma produced particles to be collected (e.g., greater than 99% of the particles in the separated components captured by the gas-solid separation system), even though the particles are small (e.g., median size less than 10 microns) and have low densities (e.g., less than 0.2 g/cm$^3$). Furthermore, the gas-solids separation systems can operate at high gas flows (e.g., greater than 5 slm), and maintain high collection efficiencies (e.g., greater than 99%). The gas-solids separation systems can also be integrated in-line with microwave plasma reactors without disturbing the environment within the reactor (e.g., the gas flows and oxygen levels). For example, the gas-solid separation systems described herein can achieve low pressure drops across the gas-solid separation systems (e.g., less than 0.5 psig, or from 0.5 to 10 psig pressure drop across the gas-solid separation system). In some embodiments, these low pressure drops can be achieved at high flow rates (e.g., greater than 5 slm) and with high collection efficiencies (e.g., greater than 99% of the particles in the separated components captured by the gas-solid separation system). Additionally, the components of the gas-solids separation systems are compatible with hot separated components output from the reactors. The gas-solid separation systems that include a cyclone separator followed by a back-pulse filter system are particularly advantageous, because such a system enables a large fraction of particles (e.g., greater than 99%) to be captured, without causing a large pressure drop across the gas-solid separation system. This contrasts with conventional systems that use a single back-pulse filter, which will experience large pressure drops as a large quantity of particles are captured in the filter element. The cyclone separators and back-pulse filter system within the gas-solids separation systems described herein are described in more detail below.

Cyclone Separators in Gas-Solid Separation Systems

In some embodiments, the cyclone separators have a cylindrical and/or conical interior, an input, and an output. The input of the cyclone separators can be configured to receive a gas that contains a first particle concentration. The cylindrical and/or conical interior contains a rotating flow of gas and particles (i.e., a vortex) and uses rotational effects (i.e., vortex separation) to separate the particles from the gas. The output of the cyclone separators can be configured to expel a gas that contains a second particle concentration. Since some fraction of the particles are filtered by the cyclone separator, the second particle concentration is less than the first particle concentration. In some embodiments, the cyclone separators additionally contain a solids collection port, through which the particles that are filtered by the cyclone separator can be removed. In some embodiments, the solids collection port is connected to a load lock system, such that the particles that are filtered by the cyclone separator can be removed without exposing the interior of the cyclone separator to air. In some embodiments, the solids collection ports of the cyclone separators are connected to a jacketed (i.e., cooled, or heated) hopper to store the collected particles. In some embodiments, solids collection ports of the cyclone separators are connected to a jacketed hopper, which is in turn connected to an additional particle storage unit (e.g., a vessel, a sack, a bag, or a supersack), which is used to store the collected particles and/or prepare for shipping. In some embodiments, a mechanical system (e.g., conveyor, belt, auger, screw type of system, or piston push rod) is included in the cyclone separators to transport the filtered particles from the internal environment to the output, to aid in particle collection.

In some embodiments, the cyclone separators in the gas-solids separation systems operate at flow rates from 0.1 ACFM (actual cubic feet per minute) to 100 ACFM, or from 0.1 ACFM to 50 ACFM, or from 0.1 ACFM to 10 ACFM, or from 1 ACFM to 100 ACFM, or from 1 ACFM to 50 ACFM, or from 10 ACFM to 100 ACFM, or from 10 ACFM to 50 ACFM, or greater than 1 ACFM, or greater than 10 ACFM, or greater than 20 ACFM. In some embodiments, the cyclone separators in the gas-solids separation systems operate at temperatures from 80° C. to 550° C., or from 80° C. to 500° C., or from 80° C. to 450° C., or from 80° C. to 400° C., or from 80° C. to 350° C., or from 80° C. to 300° C., or from 80° C. to 250° C., or from 80° C. to 200° C., or from 100° C. to 550° C., or from 100° C. to 500° C., or from 100° C. to 450° C., or from 100° C. to 400° C., or from 100° C. to 350° C., or from 100° C. to 300° C., or from 100° C. to 250° C., or from 100° C. to 200° C., or greater than 80° C., or greater than 100° C., or greater than 200° C., or greater than 300° C., or greater than 400° C. In some embodiments, the cyclone separators in the gas-solids separation systems operate at pressures from 0.1 psig (pounds per square inch gauge) to 300 psig, or from 0.1 psig to 200 psig, or from 0.1 psig to 100 psig, or from 0.1 psig to 10 psig, or from 1 psig to 300 psig, or from 1 psig to 200 psig, or from 1 psig to 100 psig, or from 1 psig to 10 psig, or from 10 psig to 200 psig, or from 10 psig to 100 psig, or greater than 0.1 psig, or greater than 1 psig, or greater than 10 psig, or greater than 100 psig. In some embodiments, the cyclone separators in the gas-solids separation systems operate at pressure drops (i.e., pressure difference between the input and the output) from 0.1 psig to 10 psig, or from 0.1 psig to 5 psig, or from 1 psig to 10 psig, or from 1 psig to 5 psig, or greater than 0.1 psig, or greater than 1 psig, or greater than 3 psig, or greater than 5 psig. In some embodiments, the length (i.e., the dimension approximately aligned with the axis of the vortex) of the interior of the cyclone separator is from 0.1 m to 10 m, or from 0.1 m to 5 m, or from 0.1 m to 2 m, or from 0.1 m to 1 m, or from 0.1 m to 0.5 m, or from 0.5 m to 10 m, or from 0.5 m to 5 m, or from 0.5 m to 2 m, or from 0.5 m to 1.5 m, or greater than 0.1 m, or greater than 0.2 m, or greater than 0.5 m, or greater than 1 m, or greater than 1.5 m, or greater than 2 m, or greater than 5 m.

In some embodiments, the diameter of the cylindrical and/or conical interior of the cyclone separator is from 1 cm to 50 cm, or from 1 cm to 20 cm, or from 1 cm to 10 cm, or from 5 cm to 50 cm, or from 5 cm to 30 cm, or from 5 cm to 20 cm, or from 5 cm to 10 cm, or greater than 1 cm, or greater than 5 cm, or greater than 10 cm, or greater than 20 cm.

The cyclone separators described herein enable a high fraction of microwave plasma produced particles to be collected (e.g., greater than 90%), even though the particles are small (e.g., median size less than 10 microns) and have low densities (e.g., less than 0.2 g/cm$^3$). Furthermore, the cyclone separators can operate at high gas flows (e.g., greater than 5 slm), and maintain high collection efficiencies (e.g., greater than 90%). The cyclone separators can also be integrated in-line with microwave plasma reactors without disturbing the environment within the reactor (e.g., the gas flows and oxygen levels). Additionally, the cyclone separators are compatible with hot separated components output from the reactors.

Back-Pulse Filter Systems in Gas-Solid Separation Systems

In some embodiments, the back-pulse filter systems contain back-pulse filters, each back-pulse filter with an interior containing one or more filter elements, a filtering input, and a filtering output. The filtering input of the back-pulse filters can be configured to receive a gas that contains a first particle concentration in the upstream direction of the filter element. The filter element contains pores to separate the particles from the gas. The filtering output of the back-pulse filters can be configured to expel a gas from the downstream side of the filter element that contains a second particle concentration. Since some fraction of the particles are filtered by the back-pulse filter, the second particle concentration is less than the first particle concentration. In some embodiments, the back-pulse filters additionally contain a solids collection port, through which the particles that are filtered by the back-pulse filter can be removed. In some embodiments, the solids collection port is connected to a load lock system, such that the particles that are filtered by the back-pulse filter can be removed without exposing the interior of the back-pulse filter to air. In some embodiments, the solids collection ports of the back-pulse filter are connected to a jacketed (i.e., cooled, or heated) hopper to store the collected particles. In some embodiments, solids collection ports of the back-pulse filter are connected to a jacketed hopper, which is in turn connected to an additional particle storage unit (e.g., a vessel, a sack, a bag, or a supersack), which is used to store the collected particles and/or prepare for shipping. In some embodiments, a mechanical system (e.g., conveyor, belt, auger, screw type of system, or piston push rod) is included in the back-pulse filter to transport the filtered particles from the internal environment to the output, to aid in particle collection.

The back-pulse filter system can contain one or more back-pulse filters, and a valve system for directing flow through the one or more back-pulse filters in forward or reverse directions. Each back-pulse filter in the system can be in a filtering state or a cleaning state. During the filtering state, the gas and particle mixture is flowing through filter elements inside the back-pulse filters in a forward direction (i.e., from the upstream to the downstream side of the filter element). The filter elements can be porous, such as sintered particles, a screen or mesh, and the particles can be filtered out of the mixture and be captured in the pores of the filter elements. The particles that are captured in the pores of the filter elements inside of the back-pulse filters can be dislodged by directing gas flow through the filter elements in the reverse direction (i.e., from the downstream to the upstream side of the filter element).

In some embodiments, the back-pulse filters can contain one or more additional ports configured to aid in the cleaning process. For example, one or more back-pulse inputs can be configured to receive a back-pulse gas pulse into the back-pulse filter interior, which is used to dislodge the particles captured in the filter element. Since the back-pulse pulse is used to dislodge the particles in the filter, the back-pulse input(s) are located at the downstream side of the filter element, and direct the back-pulse gas through the filter element from the downstream to the upstream side. In some embodiments, one or more back-pulse outputs can be configured to emit a back-pulse gas pulse from the upstream side of the filter element, after it has dislodged the particles captured in the filter element. In some embodiments, when the back-pulse filter is in the cleaning state, the filtering input(s) and filtering output(s) are closed (e.g., using valves), and the back-pulse input(s) and output(s) are open. Conversely, in some embodiments, when the back-pulse filter is in the filtering state, the filtering input(s) and filtering output(s) are open (e.g., using valves), and the back-pulse input(s) and output(s) are closed.

In some embodiments, a plurality of back-pulse filters is arranged in parallel such that a first back-pulse filter of the plurality of back-pulse filters can be in the cleaning state while other back-pulse filters of the plurality of back-pulse filters are in the filtering state. This enables the overall back-pulse filter system to continuously filter particles from the microwave plasma reactor, without having to stop particle production to clean the filters. The number of back-pulse filters arranged in parallel can be from, for example, 2 to 10, and the number of back-pulse filters in the filtering state and the cleaning state can change throughout a processing run. In some embodiments, the duration of the back-pulse gas pulse into the back-pulse filter interior, used to dislodge the particles captured in the filter element, is approximately 1 second, or 2 seconds, or 5 seconds, or 10 seconds, or greater than 1 second, or greater than 2 seconds, or greater than 10 seconds. In some embodiments, the back-pulse filter is cleaned without using the valve system to isolate the back-pulse filter from the reactor. In other embodiments, the back-pulse gas pulse is prevented from interacting with the rest of the system (e.g., the reactor and other components of the gas-solid separation system) by isolating the back-pulse filter during cleaning (e.g., using a system of valves, and other back-pulse filters in parallel).

In some embodiments, the back-pulse filter can be isolated from the rest of the gas-solid separation system (e.g., using a system of valves) to allow the collected carbon particles to cool before being moved to a subsequent component of the system (e.g., for storage).

Additionally, in some embodiments, the total pressure drop across the back-pulse filter system is managed using systems with a plurality of back-pulse filters arranged in parallel. For example, a system of valves can be used to select one or more back-pulse filters to operate, while one or more other back-pulse filters are isolated. In some embodiments, the number of filters in the filtering state and the cleaning state can be chosen to create a certain pressure drop across the back-pulse filter system.

In some embodiments, the filter elements in the back-pulse filters contain porous metal materials (e.g., porous stainless steel, sintered stainless steel, etc.), or porous ceramic materials, or a polymer (e.g., polyimide). In some embodiments, the pore size of the filter elements in the back-pulse filters is greater than 1 micron, or greater than 2 microns, or greater than 5 microns, or greater than 10 microns, or greater than 20 microns, or from 500 nm to 50 microns, or from 1 to 30 microns, or from 1 to 20 microns, or from 1 to 10 microns.

In some embodiments, the back-pulse filters (in the back-pulse filtration systems) in the gas-solids separation systems operate at flow rates from 0.1 ACFM (actual cubic feet per minute) to 100 ACFM, or from 0.1 ACFM to 50 ACFM, or from 0.1 ACFM to 10 ACFM, or from 1 ACFM to 100 ACFM, or from 1 ACFM to 50 ACFM, or from 10 ACFM to 100 ACFM, or from 10 ACFM to 50 ACFM, or greater than 1 ACFM, or greater than 10 ACFM, or greater than 20 ACFM. In some embodiments, the back-pulse filters in the gas-solids separation systems operate at temperatures from 80° C. to 550° C., or from 80° C. to 500° C., or from 80° C. to 450° C., or from 80° C. to 400° C., or from 80° C. to 350° C., or from 80° C. to 300° C., or from 80° C. to 250° C., or from 80° C. to 200° C., or from 100° C. to 550° C., or from 100° C. to 500° C., or from 100° C. to 450° C., or from 100° C. to 400° C., or from 100° C. to 350° C., or from 100° C. to 300° C., or from 100° C. to 250° C., or from 100° C. to 200° C., or greater than 80° C., or greater than 100° C., or greater than 200° C., or greater than 300° C., or greater than 400° C. In some embodiments, the back-pulse filters in the gas-solids separation systems operate at pressures from 0.1 psig (pounds per square inch gauge) to 300 psig, or from 0.1 psig to 200 psig, or from 0.1 psig to 100 psig, or from 0.1 psig to 10 psig, or from 1 psig to 300 psig, or from 1 psig to 200 psig, or from 1 psig to 100 psig, or from 1 psig to 10 psig, or from 10 psig to 200 psig, or from 10 psig to 100 psig, or greater than 0.1 psig, or greater than 1 psig, or greater than 10 psig, or greater than 100 psig. In some embodiments, the back-pulse filters in the gas-solids separation systems operate at pressure drops (i.e., pressure difference between the input and the output) from 0.1 psig to 10 psig, or from 0.1 psig to 5 psig, or from 1 psig to 10 psig, or from 1 psig to 5 psig, or greater than 0.1 psig, or greater than 1 psig, or greater than 3 psig, or greater than 5 psig.

The back-pulse filter systems described herein enable a high fraction of microwave plasma produced particles to be collected (e.g., greater than 99%), even though the particles are small (e.g., median size less than 1 microns) and have low densities (e.g., less than 0.2 g/cm$^3$). Furthermore, the back-pulse filter systems can operate at high gas flows (e.g., greater than 5 slm), and maintain high collection efficiencies (e.g., greater than 90%). The back-pulse filter systems can also be integrated in-line with microwave plasma reactors without disturbing the environment within the reactor (e.g., the gas flows and oxygen levels). Additionally, the back-pulse filter systems are compatible with hot separated components output from the reactors. The back-pulse filter systems described herein also enable truly interruption-free continuous operation by combining more than one back-pulse filters in parallel configured with a system of valves that allow some filters to be filtering while others are being cleared with back-pulses.

Microwave Chemical Processing Systems: Gas Production

In some embodiments, microwave chemical processing systems produce gases, and the gaseous products are cooled, compressed, and/or purified prior to storage. In some embodiments, the gaseous product produced is hydrogen, with a purity of greater than 90%, or greater than 95%, or greater than 99%, or greater than 99.5%, or greater than 99.9%, or greater than 99.95%, or greater than 99.99%, or greater than 99.999%. In some cases, the hydrogen upon exiting the microwave plasma reactor, or upon exiting the gas-solids separation system (if present) has a purity level that may require additional purification to meet the required hydrogen gas final product specifications.

In some embodiments, hydrogen gas is produced, and after exiting the microwave plasma reactor, or after exiting the gas-solids separation system (if present), the hydrogen gas is cooled (e.g., using a dry cooler), accumulated (e.g., in an hydrogen gas accumulator), compressed (e.g., in a hydrogen gas compressor), and purified (e.g., in a pressure-swing absorber, dense polymer membrane purifier, micro-porous ceramic purifier, dense metallic purifier, porous carbon purifier, dense ceramic purifier, or cryogenic purifier) before storing (e.g., in a hydrogen gas storage system).

Skid Integration

In some embodiments, the microwave chemical processing systems described herein can be integrated into a skid (or, modular process skid). A modular process skid can be a contained process system that allows the system to be easily transported. Skids can contain complete process systems, and multiple process skids can be combined to create larger process systems or entire portable plants. Process skids have some advantages compared to traditional construction where process system parts are shipped individually and installed incrementally at the manufacturing site. Process skids can also provide parallel construction advantages, since the process systems are built off-site in a fabrication facility while other upgrades are completed at the plant site simultaneously.

Figure 2B:
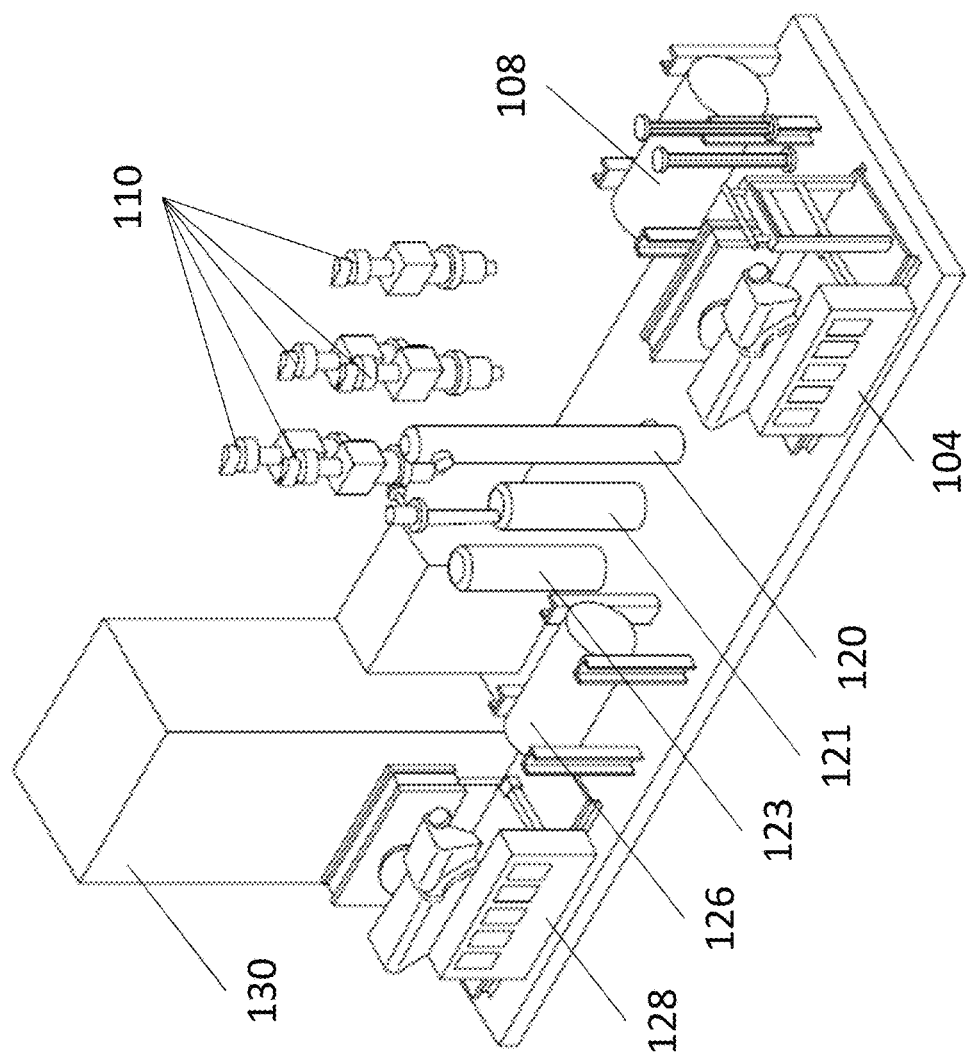
FIG. 2B is a schematic of a microwave chemical processing system integrated into a skid, in accordance with some embodiments.

FIG. 2B shows an example of a microwave chemical processing system integrated into a skid. The elements shown in FIG. 2B correspond to the same elements in the system diagram in FIG. 2A. The natural gas (NG) compressor 104, the NG accumulator 108, the microwave plasma reactors 110, the effluent cooler (heat exchanger) 120, a cyclone separator 121, the back-pulse filter system 123, the H2 accumulator 126, the H2 compressor 128, and the pressure swing absorber (PSA) 130, are all shown in the figure, approximately to scale and in the locations required for skid integration. The cyclone separator 121 and the back-pulse filter system 123 are configured with hoppers in FIG. 2B, for storing the carbon particles filtered by the cyclone separators and back-pulse filter systems. Other components of the microwave chemical processing system that are integrated into the skids are not shown for simplicity.

In some embodiments, some components of the microwave chemical processing systems described herein are required to be located away from the skid, for example on an external pad. One example of such components are the microwave generator power sources, which can be required to be located some distance (e.g., greater than 15 feet) away from the skids in certain applications.

In some embodiments, the microwave chemical processing system is integrated into a skid, and the skid is used in a local (i.e., point of use) application, such as an application where the input materials are produced in the same location as the skid, and/or where the separated components are utilized in the same location as the skid. For example, a microwave chemical processing system integrated into a skid can be located at a landfill, and the skid can convert the locally produced methane (or bio-gas) into higher value products (i.e., hydrogen gas and carbon particles). As another example, a microwave chemical processing system integrated into a skid can be located at an oil refinery, and the skid can produce hydrogen from hydrocarbons, and the hydrogen can be utilized for oil refining. In other embodiments, the microwave chemical processing system is integrated into a skid, and the skid is used in a regional or remote application, such as an application where the input materials are produced in a different location from the skid, and/or where the separated components are utilized in a different location from the skid. For example, a number of a microwave chemical processing systems integrated into skids can be co-located at a regional site, where input materials (e.g., hydrocarbons) are delivered to the regional site and the separated components (e.g., hydrogen gas and carbon particles) are shipped to other locations for utilization (e.g., compressed hydrogen gas to power hydrogen fuel cells, or particulate carbon as a tire additive).

Microwave Reactors

In some embodiments, the carbon particles, nanoparticles, aggregates and materials described herein are produced using microwave plasma reactors and methods, such as any appropriate microwave reactor and/or method described in U.S. patent application Ser. No. 15/351,858, entitled "Microwave Chemical Processing," or in U.S. patent application Ser. No. 15/428,474, now issued as U.S. Pat. No. 9,767,992, and entitled "Microwave Chemical Processing Reactor," which are assigned to the same assignee as the present application, and are incorporated herein by reference as if fully set forth herein for all purposes. Additional information and embodiments for microwave plasma gas processing system methods and apparatuses to produce the carbon nanoparticles and aggregates described herein are also described in the aforementioned U.S. patent application and U.S. patent, and shall be described below in relation to FIGS. 3A-3H.

In some embodiments, microwave plasma chemical processing of process materials (e.g., hydrocarbon gases, or liquid mixtures) is used to produce solid particles and gaseous products (e.g., the carbon particles, nanoparticles and aggregates described herein and hydrogen). More specifically, microwave plasma chemical processing of precursor materials using various techniques, including pulsing of the microwave radiation to control the energy of the plasma, can be used to produce solid particles and gaseous products (e.g., the carbon particles, nanoparticles and aggregates described herein and hydrogen). The ability to control the energy of the plasma enables the selection of one or more reaction pathways in conversion of the precursor materials into specific separated components. Pulsed microwave radiation can be used to control the energy of the plasma, because the short-lived high-energy species that are created when a plasma ignites can be re-generated at the start of each new pulse. The plasma energy is controlled to have a lower average ion energy than conventional techniques, but at a high enough level to enable the targeted chemical reactions to occur at high precursor material flows and high pressures.

Conventional microwave plasma chemical processing systems using pulsed microwave radiation to control the energy of the plasma have very high cracking efficiency, in excess of 90%. These conventional systems, however, use low gas flow rates, below 1 standard liter per minute (slm), and small gas volumes within the plasma, with a consequence that the production rate is low and the production cost is high. These conventional systems cannot increase the gas flow rate and the gas volume within the plasma while using high frequency microwave pulsing (e.g., above approximately 100 Hz) because the plasma cannot ignite fast enough to keep up with the pulses when a large volume and high flow of gas is used.

In contrast to previously developed systems, in some embodiments, a microwave plasma can be generated in a supply gas and/or precursor material, and the energy in the plasma is sufficient to form separated components, including the carbon nanoparticles and aggregates described herein, from precursor material molecules. In some embodiments, a source of microwave radiation is coupled to a reaction chamber, the plasma is generated along a first portion of the length of the reaction chamber, and the precursor material is separated into components, including the carbon nanoparticles and aggregates described herein, along a second portion of the length of the reaction chamber. In some embodiments, the microwave radiation is coupled directly into the plasma and not through a dielectric wall as in conventional methods.

In methods of the present embodiments regarding microwave plasma chemical processing of precursor materials to produce solid particles and gaseous products (e.g., the carbon particles, nanoparticles and aggregates described herein and hydrogen), pulsed microwave radiation is supplied through a waveguide having a length, where the microwave radiation propagates in a direction along the waveguide. A pressure within the waveguide is at least 0.1 atmosphere. A supply gas is provided into the waveguide at a first location along a length of the waveguide, where a majority of the supply gas flows in the direction of the microwave radiation propagation. A plasma is generated in the supply gas in at least a portion of the length of the waveguide, and a precursor material (e.g., a process gas, or a liquid precursor) is added into the waveguide at a second location downstream from the first location. A majority of the precursor material flows in the direction of the microwave propagation at a rate greater than 5 slm, or greater than 5 L/min for liquid mixtures. An average energy of the plasma is controlled to convert the precursor material into separated components, including the carbon nanoparticles and aggregates described herein, by controlling at least one of i) a pulsing frequency of the pulsed microwave radiation, where the pulsing frequency is greater than 500 Hz; and ii) a duty cycle of the pulsed microwave radiation, where the duty cycle is less than 90%.

In some embodiments, microwave plasma chemical processing systems include a waveguide having a first gas inlet, a second gas inlet downstream of the first gas inlet, and a length. The first inlet is configured to receive a supply gas, and the second inlet is configured to receive a precursor materials (e.g., a process gas, or a liquid mixture). A pulsed microwave radiation source is coupled to the waveguide to generate a plasma in the supply gas, where the microwave radiation propagates in a direction along the length of the waveguide to react with the precursor material. The microwave radiation source is configured to pulse microwave radiation on and off at a frequency from 500 Hz to 1000 kHz and with a duty cycle less than 90%. The majority of the flow of the supply gas and the majority of the flow of the precursor material are parallel to the direction of the microwave propagation. The flow of the process gas is greater than 5 slm, and the waveguide is configured to accommodate pressures of at least 0.1 atmosphere.

In some embodiments, the waveguides of the microwave chemical processing reactors of the present disclosure are field-enhancing waveguides that enable high throughputs of an input material to be processed, where the waveguide itself serves as a reaction chamber rather than having the processed material in a separate quartz chamber from the microwave energy waveguide as in conventional systems. The design of the reactor system provides a large volume for the chemical reactions to occur and reduces the impact of particulate build-up and the amount of particulate on the walls of the reaction chamber. Particulate build-up on the quartz walls in conventional systems reduces the efficiency of the chemical processing since the microwave energy must penetrate the quartz walls in which the processed gas is contained. In the present systems, the microwave energy is propagated in a waveguide that serves as the reaction chamber for the processed material, and thus the microwave energy will not be hindered by particulate that may be deposited onto the walls of the chamber (i.e., waveguide).

As used herein, the term "field-enhancing waveguide" (FEWG) refers to a waveguide with a first cross-sectional area and a second cross-sectional area, where the second cross-sectional area is smaller than the first cross-sectional area and is farther away from the microwave energy source than the first cross-sectional area. The decrease in cross-sectional area enhances the field by concentrating the microwave energy, with the dimensions of the waveguide being set to maintain propagation of the specific microwave frequency being used. The second cross-sectional area of the FEWG extends along a reaction length that forms the reaction zone of the FEWG. There is a field-enhancing zone between the first cross-sectional area and the second cross-sectional area of a FEWG. In some embodiments, the field-enhancing zone can change cross-sectional area in a continuous manner (e.g., linearly or non-linearly) or an abrupt manner (e.g., through one or more discrete steps). In some embodiments, the pressure within the FEWGs and/or in the reaction zone of the reactor are from 0.1 atm to 10 atm, or from 0.5 atm to 10 atm, or from 0.9 atm to 10 atm, or greater than 0.1 atm, or greater than 0.5 atm, or greater than 0.9 atm.

Figure 3A:
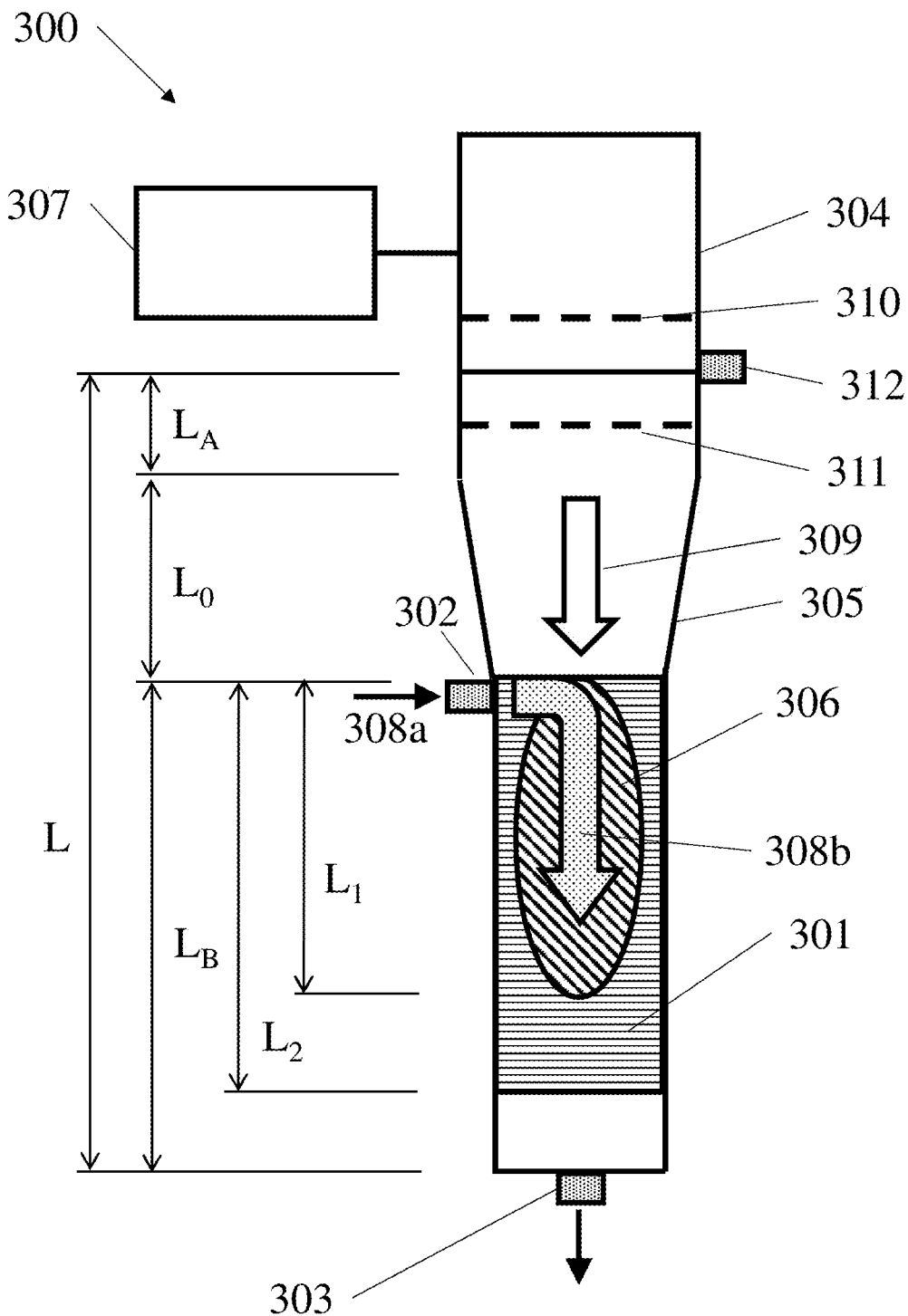
FIG. 3A is a simplified vertical cross-section of a microwave plasma reactor, in accordance with some embodiments.

FIG. 3A shows an embodiment of a microwave chemical processing system of the present disclosure, in which a "field-enhancing waveguide" (FEWG) is coupled to a microwave energy generator (i.e., a microwave energy source), a plasma is generated from a supply gas in a plasma zone of the FEWG, and a reaction length of the FEWG serves as the reaction zone to separate the process material into separate components. The present reactor as demonstrated by FIG. 3A is absent of a dielectric barrier between the field-enhancing zone of the field-enhancing waveguide and the reaction zone. In contrast, the reaction zones of conventional systems, are enclosed within a dielectric barrier such as a quartz chamber as explained previously. The direction of propagation of the microwave energy is parallel to the majority of the flow of the supply gas and/or the process material (i.e., precursor material), and the microwave energy enters the waveguide upstream of the portion of the FEWG where the separated components are generated.

As shown in FIG. 3A, a microwave chemical processing reactor 300, in accordance with some embodiments, generally includes a FEWG 305, one or more inlets 302 configured to receive supply gas and/or process material 308a flowing into the FEWG 305, and a microwave energy source 304 that is coupled to the FEWG 305, among other elements not shown for simplicity. The "process material" can also be referred to as the "input material", the "precursor material", or in some embodiments, the "process gas". The inlets 302 can be designed to accommodate gaseous or liquid mixture precursor materials. In the case of liquid precursors, in some embodiments, the inlet 302 can include an atomizer (or other assembly) to effectively disperse the liquid precursor in the reactor. In some embodiments, a bubbler can be used to vaporize a liquid, and the vapor provided to the inlet 302.

In some embodiments, microwave circuit 307 controls a pulsing frequency at which microwave energy 309 from microwave energy source 304 is pulsed. In some embodiments, the microwave energy 309 from microwave energy source 304 is continuous wave.

The FEWG 305 has a length L. The portion of the FEWG 305 with length $L_A$ (shown in FIG. 3A) is closer to the microwave energy generator than the portion of the FEWG with length $L_B$ (shown in FIG. 3A). Throughout this disclosure, different portions of the FEWG will be described by a capital L with a subscript denoting the certain portion of the FEWG (e.g., $L_A$, $L_0$, $L_B$, $L_1$, $L_2$), and synonymously, the lengths of the different portions of the FEWG will also be described by a capital L with a subscript denoting the length of a certain portion of the FEWG (e.g., $L_A$, $L_0$, $L_B$, $L_1$, $L_2$).

The cross-sectional area of the FEWG in length $L_B$ is smaller than the cross-sectional area of the FEWG in length $L_A$. The length of the FEWG $L_0$, is located between lengths $L_A$ and $L_B$ of the FEWG, and has a decreasing cross-sectional area along the path of the microwave energy propagation. The decrease in cross-sectional area serves to concentrate the electric field, thus increasing the microwave energy density while still providing a significant amount of area in which plasma can be formed compared to conventional systems. The portion of the FEWG with length $L_B$ (shown in FIG. 3A) may have a rectangular cross-section of dimensions 0.75 inches by 3.4 inches when using a microwave energy frequency of 2.45 GHz. This cross-sectional area is much greater than conventional systems where the plasma generation area is generally less than one square inch. The dimensions of the different portions of the FEWG 305 are set according to the microwave frequency, in order to properly function as a waveguide. For example, for an elliptical waveguide the cross-sectional dimensions can be 5.02 inches by 2.83 inches for 2.1-2.7 GHz.

In conventional microwave plasma materials processing systems, the limited region in which plasma can form, such as less than one square inch as described above, constrains the volume in which gas reactions can occur. Also, in conventional systems the microwave energy enters the reaction chamber through a window (typically quartz). In these systems, dielectric materials (e.g., particulate carbon) are coated on the window during processing leading to a decreased power delivery over time. This can be highly problematic if these separated components absorb microwave energy because they can prevent the microwave energy from coupling into the reaction chamber to generate the plasma. Consequently, a rapid build-up of by-products, such as carbon particles that are produced from the gas reactions, occurs and limits the run-time of the processing equipment. In the present embodiments, the system 300 and other embodiments described below are designed without the use of a window in the reaction zone; that is, using a parallel propagation/gas flow system where the energy enters upstream from the reaction. As a result, more energy and power can be coupled into the plasma from the microwave energy source. The lack of a window and the greater volume within the waveguide 305, compared to limited reaction chamber volumes in conventional systems, greatly reduces the issue of particle build-up causing limited run-times, thus improving production efficiency of the microwave processing system.

The microwave energy 309 in FIG. 3A creates a microwave plasma 306 in the supply gas and/or process material within a plasma zone with length $L_1$ (shown in FIG. 3A) of the length of the FEWG 305. The plasma zone with length $L_1$ is located within the portion of the FEWG $L_B$, where the cross-sectional area is smaller and the microwave energy density is higher than in length $L_A$. In some embodiments, a supply gas that is different from the process material is used to generate the microwave plasma 306. The supply gas may be, for example, hydrogen, helium, nitrogen, a noble gas such as argon, or mixtures of more than one type of gas. In other embodiments, the supply gas is the same as the process material, where the process material is the material from which separated components are being created.

In some embodiments, the supply gas and/or process material inlet 302 is located upstream from the portion of the FEWG $L_B$, or is located within the portion of the FEWG $L_0$, or is located within the portion of the FEWG $L_A$, or is located upstream of the portion of the FEWG $L_A$. In some embodiments, the portion of the FEWG $L_1$ extends from a position along the FEWG downstream from the position where the supply gas and/or process material 308a enters the FEWG, to the end of the FEWG or to a position between the entrance of the supply gas and/or process material and the end of the FEWG 305. In some embodiments, the portion of the FEWG $L_1$ extends from where the supply gas and/or process material 308a enters the FEWG, to the end of FEWG or to a position between the entrance of the supply gas and/or process material and the end of the FEWG.

The generated plasma 306 provides energy for reactions to occur in process material 308b within a reaction zone 301 of the FEWG 305 having a reaction length $L_2$. In some embodiments, reaction zone $L_2$ extends from where the process material 308a enters the FEWG 305, to the end of the FEWG 305 or to a position between the entrance of the process material and the end of the FEWG 305. Given the right conditions, the energy in the plasma 306 will be sufficient to form separated components from the process material molecules. One or more outlets 303 are configured to collect the separated products out of the FEWG 305 downstream of the reaction zone portion 301 of the FEWG where reactions occur in the process material 308b. In the example shown in FIG. 3A, the propagation direction of the microwave energy 309 is parallel with the majority of the supply gas and/or process material flow 308b, and the microwave energy 309 enters the FEWG 305 upstream of the reaction zone 301 of the FEWG where the separated components are generated.

In some embodiments, a pressure barrier 310 that is transparent to microwave energy can be located within the microwave energy source 304, near the outlet of the microwave energy source, or at other locations between the microwave energy source 304 and the plasma 306 produced in the FEWG. This pressure barrier 310 can serve as a safety measure to protect from potential backflow of plasma into the microwave energy source 304. Plasma does not form at the pressure barrier itself; instead, the pressure barrier is simply a mechanical barrier. Some examples of materials that the pressure barrier can be made of are quartz, ethylene tetrafluoroethylene (ETFE), other plastics, or ceramics. In some embodiments, there can be two pressure barriers 310 and 311, where one or both pressure barriers 310 and 311 are within the microwave energy source 304, near the outlet of the microwave energy source, or at other locations between the microwave energy source 304 and the plasma 306 produced in the FEWG. In some embodiments, the pressure barrier 311 is closer to the plasma 306 in the FEWG than the pressure barrier 310, and there is a pressure blowout port 312 between the pressure barriers 310 and 311 in case the pressure barrier 311 fails.

In some embodiments, the local impedance within the FEWG is tailored using filaments, point sources, electrodes and/or magnets. In some embodiments, filaments, point sources, electrodes and/or magnets are used to increase the density plasma within the reaction zone of the FEWG.

Figure 3B:
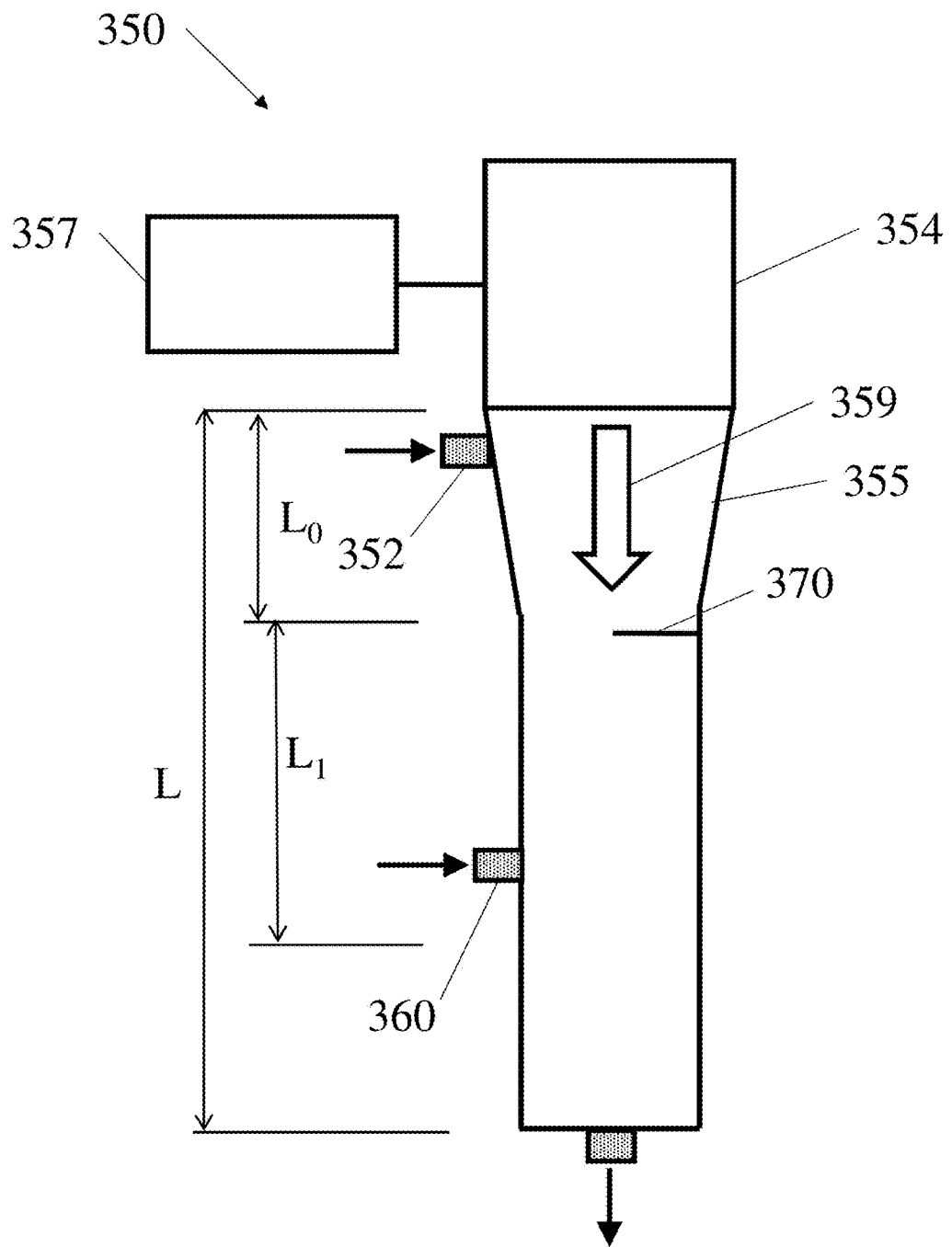
FIG. 3B is a simplified vertical cross-section of a microwave plasma reactor having a filament, in accordance with some embodiments.

FIG. 3B illustrates a microwave processing system with a FEWG and filaments. In the embodiment of FIG. 3B, the microwave processing system 350 includes a microwave energy generator (i.e., a microwave energy source) 354, a FEWG 355, and a microwave emitter circuit 357 similar to previous embodiments. Microwave energy 359 is supplied by the microwave energy source 354, to propagate in a direction down the length L of the FEWG 355. In this embodiment, supply gas inlet 352 is placed near the entrance of the portion $L_0$, rather than at the entrance to the portion $L_1$ (i.e., the plasma zone) as was illustrated in previous embodiments. One or more metal filaments 370 is placed within the FEWG 355 to assist in the ignition of the plasma and/or the excitation of higher energy species within the plasma. In this embodiment, metal filament 370 is downstream of the first gas inlet 352, near the entrance to the plasma zone portion of the FEWG $L_1$ (with a smaller cross-sectional area than the FEWG closer to the microwave energy generator). In other embodiments, the filament 370 may be located at other locations within portion $L_1$ of the overall length L of the FEWG 355, where $L_1$ is the region in the waveguide where the plasma is formed as described in relation to previous embodiments. In some embodiments, the filament 370 is located within portion $L_1$ of the FEWG and upstream of the process material inlet 360, so that it will be located outside of the portion $L_2$ (i.e., length $L_2$ shown in FIG. 3A) where reactions are taking place and which could coat the filament with reacted species. The presence of filament 370 can reduce the plasma ignition voltage by providing an ignition site, by focusing the electric field of microwave energy 359. Additionally, the filament 370 can become heated and emit electrons through thermionic emission, which further contributes to reducing the plasma ignition voltage. Although the filament 370 is illustrated as a single wire in this embodiment, filament 370 may take other configurations such as a coil or multiple filaments. In some embodiments, the filament 370 is tungsten. In some embodiments, the filament may be actively energized (powered) or may be passive. In some embodiments, the filament 370 is an osmium filament (e.g., configured as a plate, or coil, or other shape) adjacent to a heater coil. In some embodiments, the filament 370 is a ferrous material in the field of an inductive coil. In some embodiments, the filament 370 is actively heated where the active components (e.g., heating source components) are located outside of the waveguide 355 and the filament material that is being heated is inside of the waveguide 355.

The filament 370 within the FEWG can assist with the plasma ignition. In some embodiments, an advantage of using a filament 370 within the FEWG is that it enables a plasma to form quickly enough to keep up with fast microwave pulsing frequencies (e.g., at frequencies greater than 500 Hz, or greater than 1 kHz), even with high gas flows (e.g., greater than 5 slm) and large gas volumes (e.g., up to 1000 L). This is particularly important at high pressures (e.g., greater than 0.9 atm, or greater than 1 atm, or greater than 2 atm), because the high energy species will extinguish quickly in a high pressure atmosphere, and if the plasma cannot ignite fast enough, then there will be a low fraction of high-energy species (i.e., integrated over time) in a pulsed plasma at high pressures.

In some embodiments, the carbon nanoparticles and aggregates including the different carbon allotropes described herein are produced using the microwave plasma reactors with gas flows (i.e., supply gas flow, process gas flow, or input material gas flow) from 1 slm (standard liters per minute) to 1000 slm, or from 2 slm to 1000 slm, or from 5 slm to 1000 slm, or greater than 1 slm, or greater than 2 slm, or greater than 5 slm, or greater than 10 slm, or greater than 100 slm. In some embodiments, the carbon nanoparticles and aggregates described herein are produced using the microwave plasma reactors with gas residence times from 0.001 seconds to 100 seconds, or from 0.01 seconds to 100 seconds, or from 0.1 seconds to 100 seconds, or from 0.001 seconds to 10 seconds, or from 0.01 seconds to 10 seconds, or from 0.1 seconds to 10 seconds.

In some embodiments, the carbon nanoparticles and aggregates including the different carbon allotropes described herein are produced using the microwave plasma reactors with liquid precursor flows from 0.1 L/min to 1000 L/min, or from 2 L/min to 1000 L/min, or from 5 L/min to 1000 L/min, or greater than 1 L/min, or greater than 2 L/min, or greater than 5 L/min, or greater than 10 L/min, or greater than 100 L/min. In some embodiments, the carbon nanoparticles and aggregates described herein are produced using the microwave plasma reactors with liquid precursor residence times from 0.001 seconds to 100 seconds, or from 0.01 seconds to 100 seconds, or from 0.1 seconds to 100 seconds, or from 0.001 seconds to 10 seconds, or from 0.01 seconds to 10 seconds, or from 0.1 seconds to 10 seconds.

In some embodiments, the precursor material flow rate (i.e., gas or liquid flow rate) is used to tailor the mixture of allotropes produced within the reactor. At higher flow rates, the residence times are shorter, and at lower flow rates the residence times are longer. In some embodiments, there is one or more carbon allotropes that form initially, and other carbon allotropes that form subsequently and/or that grow on the surfaces of the initially formed carbon allotrope. At higher flow rates (i.e., shorter residence times) the ratio of the initially formed allotrope to the subsequently formed allotropes will be higher than it will be at lower flow rates.

One example is the production of mixtures of graphene, graphite and MWSFs. In some embodiments, MWSFs form first, and the graphene and/or graphite materials form on the surfaces of the initially formed MWSFs. In embodiments when the mixture is produced with higher flow rates, the ratio of graphene and graphite to MWSFs is lower (e.g., as low as 10% or 20%). On the other hand, in embodiments when the mixture is produced with lower flow rates, the ratio of graphene and graphite to MWSFs is higher (e.g., up to 80% or 90%) because there is more time for additional layers of graphene and graphite to grow on the MWSF surfaces.

Another example is the production of mixtures of graphene, graphite and amorphous carbon. In some embodiments, amorphous carbon forms first, and the graphene and/or graphite materials form on the surfaces of the initially formed amorphous carbon. In embodiments when the mixture is produced with higher flow rates, the ratio of graphene and graphite to amorphous carbon is lower (e.g., as low as 10% or 20%). On the other hand, in embodiments when the mixture is produced with lower flow rates, the ratio of graphene and graphite to amorphous carbon is higher (e.g., up to 80% or 90%) because there is more time for additional layers of graphene and graphite to grow on the amorphous carbon surfaces.

It is important to note that other parameters, in addition to precursor material flow rate, also affect which carbon allotropes form, and the growth rate of each, including, for example, microwave parameters (e.g., energy, power, pulse rate), chamber geometry, reaction temperature, the presence of a filament, and the precursor and supply gas species utilized. For example, when producing graphene, or mixtures of graphene and graphite, the microwave energy and power, as well as the precursor and supply gas flow rates can impact the number of layers in the graphene, and/or the ratio of graphene to graphite produced. At higher power, the rate of growth of the carbon layers increases, and at longer residence times the number of layers that are able to grow increases.

In some embodiments, the carbon nanoparticles and aggregates described herein are produced using the microwave plasma reactors with chamber volumes from 100 cm$^3$ to 100,000 cm$^3$, or from 1000 cm$^3$ to 100,000 cm$^3$, or from 100 cm$^3$ to 10,000 cm$^3$, or from 1000 cm$^3$ to 10,000 cm$^3$, or from 1000 cm$^3$ to 5,000 cm$^3$. Multiple chambers can also be used in parallel in a single reactor, and multiple reactors can be used in parallel in the same reactor system.

In some embodiments, the carbon nanoparticles and aggregates described herein are produced using the microwave plasma reactors at production rates greater than 10 kg/hr, or greater than 1 kg/hr, or from 0.1 to 100 kg/hr, or from 1 to 100 kg/hr, or from 10 to 100 kg/hr, or from 0.1 to 10 kg/hr, or from 0.1 to 1 kg/hr, or from 1 to 10 kg/hr.

Multiple Reactor Configurations

In some embodiments, the microwave plasma chemical processing reactors are arranged in different configurations in the microwave chemical processing systems of the present disclosure, as described in the aforementioned U.S. Pat. No. 9,767,992, entitled "Microwave Chemical Processing Reactor."

In some embodiments, the microwave plasma chemical processing reactors of the present disclosure have a single microwave energy generator, which is a source of microwave energy coupled to one or more than one FEWG. In some embodiments, the microwave plasma chemical processing reactors of the present disclosure have more than one microwave energy generator, coupled to more than one FEWG. In some embodiments, the microwave energy is continuous wave or pulsed. In some embodiments, the microwave energy generator power is from 1 to 100 kW.

In some embodiments, the microwave plasma chemical processing reactors of the present disclosure have more than one reaction zone, which are connected together and have one or more than one outlet from which to collect the separated components.

In some embodiments, the microwave plasma chemical processing reactors of the present disclosure contain multiple FEWGs with different geometries including manifold arrangements, and network arrangements.

In some embodiments, the microwave plasma chemical processing reactors of the present disclosure have reaction zones with walls, and the supply gas and process inlets provide the supply gas (for creating the microwave plasma) and input material to the reaction zone through the walls. In some embodiments, there are a plurality of supply gas and process inlets that provide the supply gas and input material to the reaction zone through the walls in controlled mass fractions. Providing the supply gas and input material to the reaction zone through the walls in controlled mass fractions can mitigate the deposition of the separated components on the reaction zone walls.

In some embodiments, the process material is a gas. Examples of process material (i.e., input material) gases are described above.

In some embodiments, the process material is a liquid that is provided through the process material inlet into the FEWG. Some examples of liquids that can be used as process materials are water, alkanes, alkenes, alkynes, aromatic hydrocarbons, saturated and unsaturated hydrocarbons (e.g., of alkanes, alkenes, alkynes, or aromatic hydrocarbons), ethanol, methanol, isopropyl alcohol (i.e., isopropanol), or mixtures thereof (e.g., a 50/50 mixture of ethanol/methanol). In some embodiments, the liquid process materials listed above would produce carbon and hydrogen separated components. In some embodiments, the flow rate of the liquid can be a percentage of the supply gas flow into the reactor, such as from 0.001% to 1000%, or from 0.001% to 100%, or from 0.001% to 10%, or from 0.001% to 1%, or from 0.001% to 0.1%, or from 0.01% to 1000%, or from 0.01% to 100%, or from 0.01% to 10%, or from 0.01% to 1%, or from 0.01% to 0.1%.

In some embodiments, the process material is a colloidal dispersion (i.e., a mixture of solid particles suspended in a liquid or a gas) that is provided through the process material inlet into the FEWG. For example, the colloidal dispersion can include carbonaceous particles. Some examples of colloidal dispersions that can be used as process materials are solid particles from the Group 16, Group 14, Group 10, Group 9, Group 5, Group 2, Group 1, alloys thereof, and mixtures thereof, mixed with a liquid or a gas. In some embodiments, the solid particles listed above can be mixed with liquids such as water, alkanes, alkenes, alkynes, aromatic hydrocarbons, saturated and unsaturated hydrocarbons (e.g., of alkanes, alkenes, alkynes, or aromatic hydrocarbons), ethanol, methanol, isopropyl alcohol, or mixtures thereof (e.g., a 50/50 mixture of ethanol/methanol). Examples of gases are Group 1 and Group 15-18, as well as inorganic compounds (e.g., group 14 hydride). Some examples of separated components that can be produced from the colloidal dispersion process materials listed above are solid inorganic materials coated in organic materials (e.g., silicon coated with graphene), and composite materials with interlayers of organic/inorganic materials (e.g., a silicon core with a layer of carbon encapsulating the silicon, coated with an additional inorganic layer). In some embodiments, the flow rate of the colloidal dispersion can be a percentage of the supply gas flow into the reactor, such as from 0.001% to 1000%, or from 0.001% to 100%, or from 0.001% to 10%, or from 0.001% to 1%, or from 0.001% to 0.1%, or from 0.01% to 1000%, or from 0.01% to 100%, or from 0.01% to 10%, or from 0.01% to 1%, or from 0.01% to 0.1%.

FIGS. 3C-3F show block diagrams representing embodiments of microwave chemical processing systems of the present disclosure, in which multiple FEWGs are coupled to one or more microwave energy generators (i.e., a microwave energy sources). The FEWGs in these embodiments can share some or all of the features of the systems described above. The supply gas and process material inputs in these embodiments can also share some or all of the features described above. In some embodiments, each FEWG has a reaction zone. In some embodiments, a plasma is generated from a supply gas in a plasma zone in each of the FEWGs, and a reaction length of each of the FEWGs serve as reaction zones to separate the process material into separate components. In some embodiments, the reaction zones are connected together and the microwave chemical processing system has one outlet for the separated components. In some embodiments, the reaction zones are connected together and the microwave chemical processing system has more than one outlet for the separated components. In some embodiments, each reaction zone has its own outlet for the separated components.

Figure 3C:
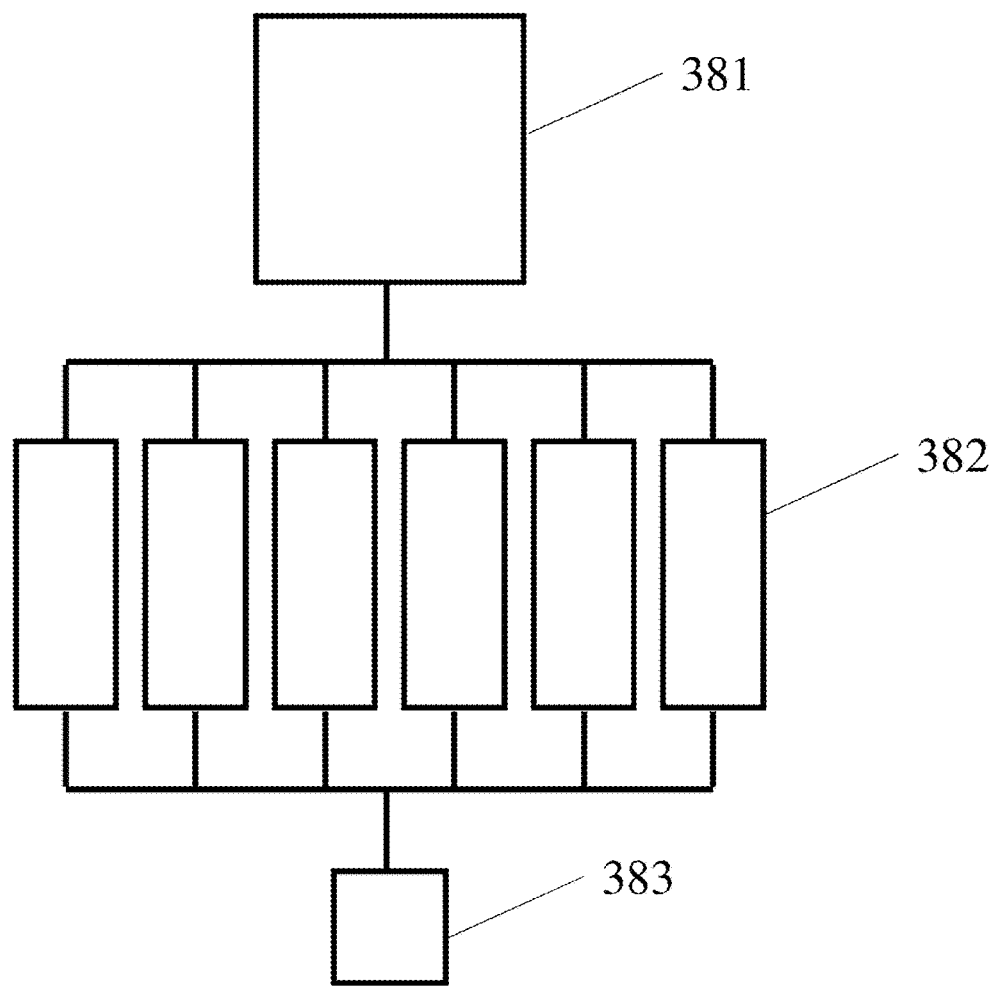
FIGS. 3C-3F are block diagrams of microwave chemical processing systems having multiple field-enhancing waveguides and multiple microwave energy sources, in accordance with some embodiments.

FIG. 3C shows an embodiment where there is one microwave energy generator 381 coupled to multiple FEWGs 382, and the reaction zones of the FEWGs are all connected together such that there is a single outlet 383 to collect the separated components.

Figure 3D:
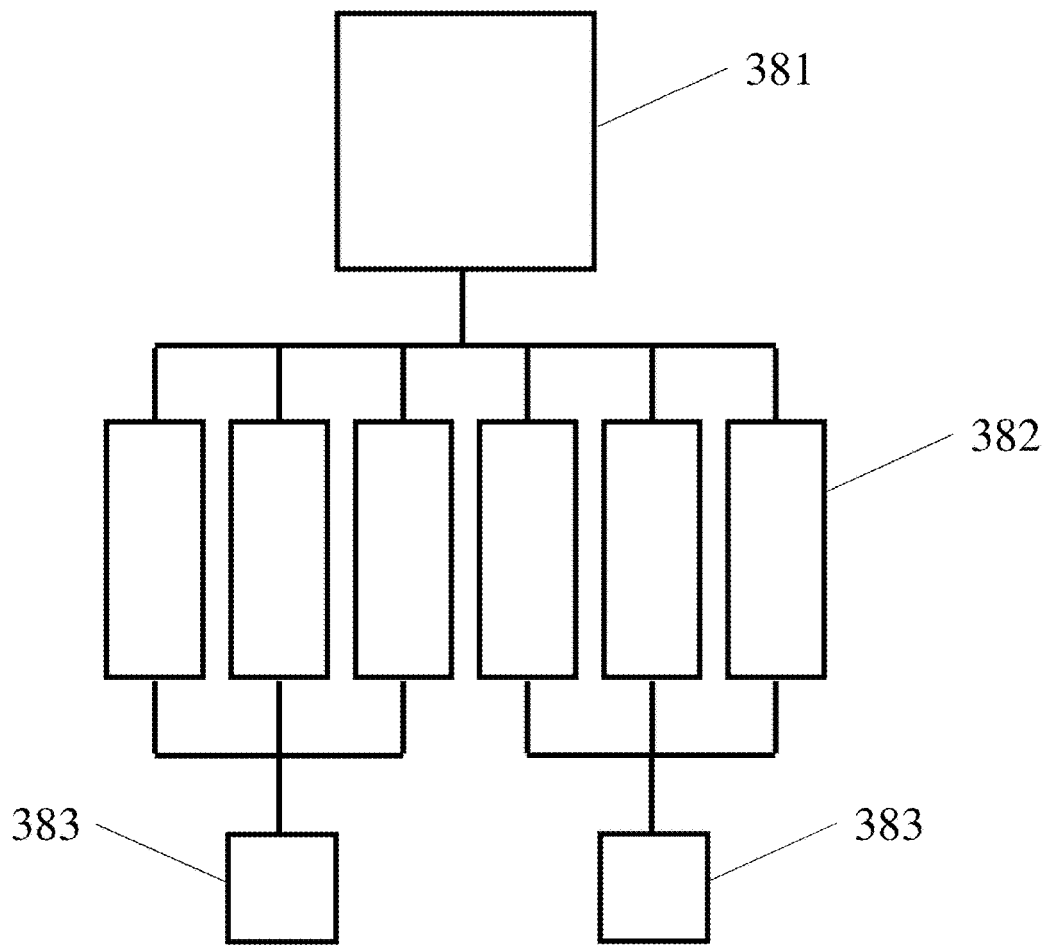

FIG. 3D shows an embodiment where there is one microwave energy generator 381 coupled to multiple FEWGs 382, and the reaction zones of some the FEWGs are connected together such that there more than one outlet 383 to collect the separated components.

Figure 3E:
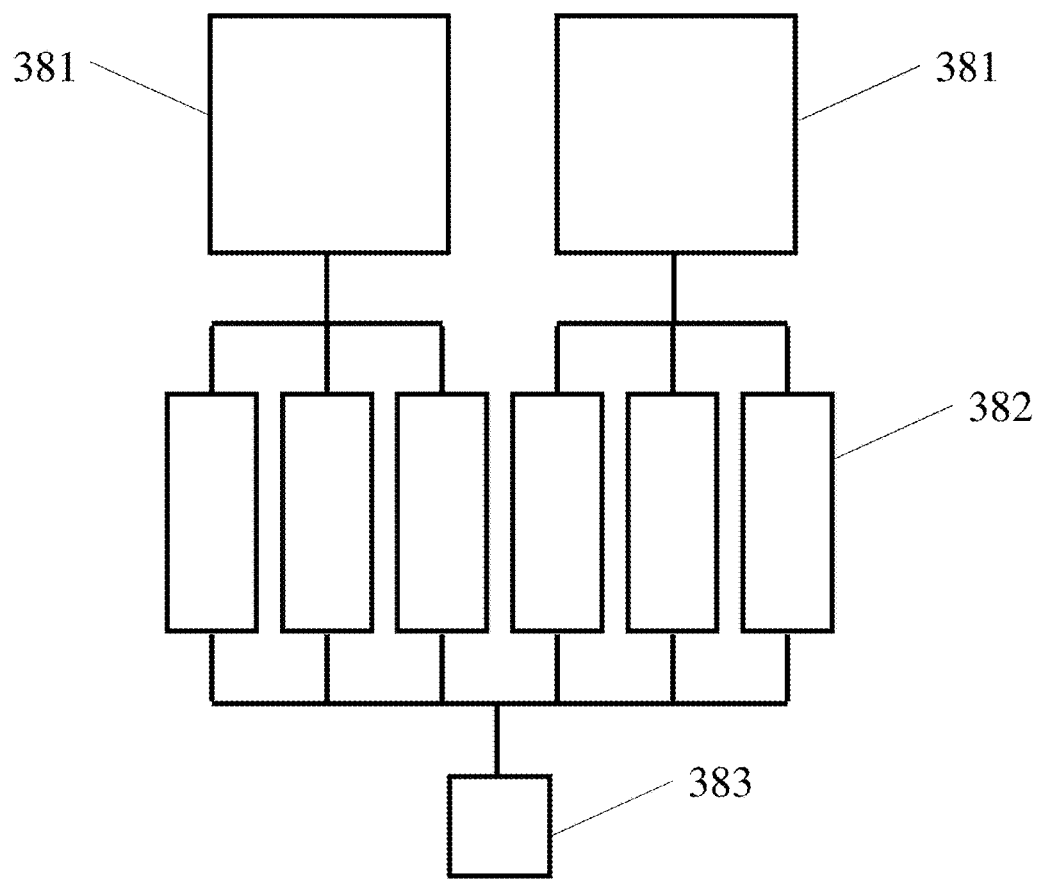

FIG. 3E shows an embodiment where there is more than one microwave energy generator 381 coupled to multiple FEWGs 382, and the reaction zones of the FEWGs are all connected together such that there is a single outlet 383 to collect the separated components.

Figure 3F:
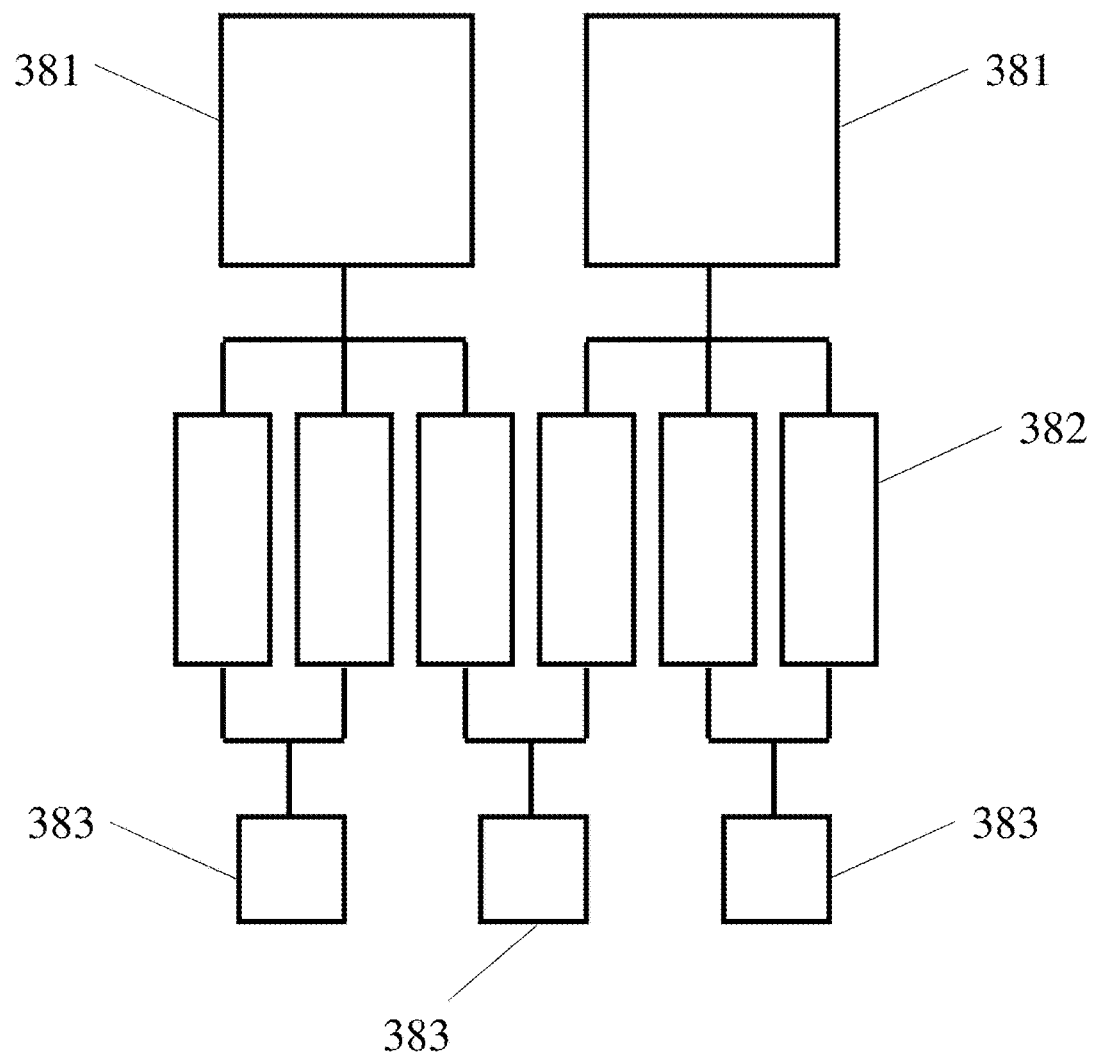

FIG. 3F shows an embodiment where there is more than one microwave energy generator 381 coupled to multiple FEWGs 382, and the reaction zones of some the FEWGs are connected together such that there more than one outlet 383 to collect the separated components.

FIGS. 3C-3F depict 6 FEWGs for illustrative purposes, but in some embodiments, there are fewer or greater than 6 FEWGs. For example, in some embodiments, there are from 1 to 10 FEWGs coupled to each microwave energy generator. In some embodiments, the microwave energy from more than one microwave generator can be combined using a power combiner, and then the combined microwave energy can be coupled into more than one FEWG. The microwave energy emitted from such a power combiner can be very large, and can be coupled into many FEWGs (e.g., more than 10). In some embodiments, multiplexing is used to couple microwave energy into multiple FEWGs from a single microwave energy source. In one example, the multiplexing is time-division multiplexing which means that the energy is coupled from a microwave energy source into one set of FEWGs at one moment in time, and a switch is used to direct the energy into a different set of FEWGs at a later moment in time. The switch can be used to cycle energy between many sets of FEWGs (e.g., more than 2, or more than 5, or more than 10) from a single microwave energy source over time, where each set of FEWGs can contain multiple FEWGs (e.g., more than 2, or more than 5, or from 1 to 10). FIG. 3D depicts two outlets, but there can be more than two outlets, such as in FIG. 3F, and each FEWG can have its own outlet to collect the separated components. In some embodiments, there are from 1 to 10 outlets to collect the separated components. FIG. 3D depicts 3 FEWGs connected into each outlet, but there can be fewer or greater than 3 FEWGs connected into each outlet, and each FEWG can have its own outlet to collect the separated components. FIGS. 3E and 3F depict two microwave energy generators, but in some embodiments, there are more than 2 microwave energy generators. In some embodiments, there are from 1 to 10 FEWGs connected together into each outlet to collect the separated components.

Figure 3G:
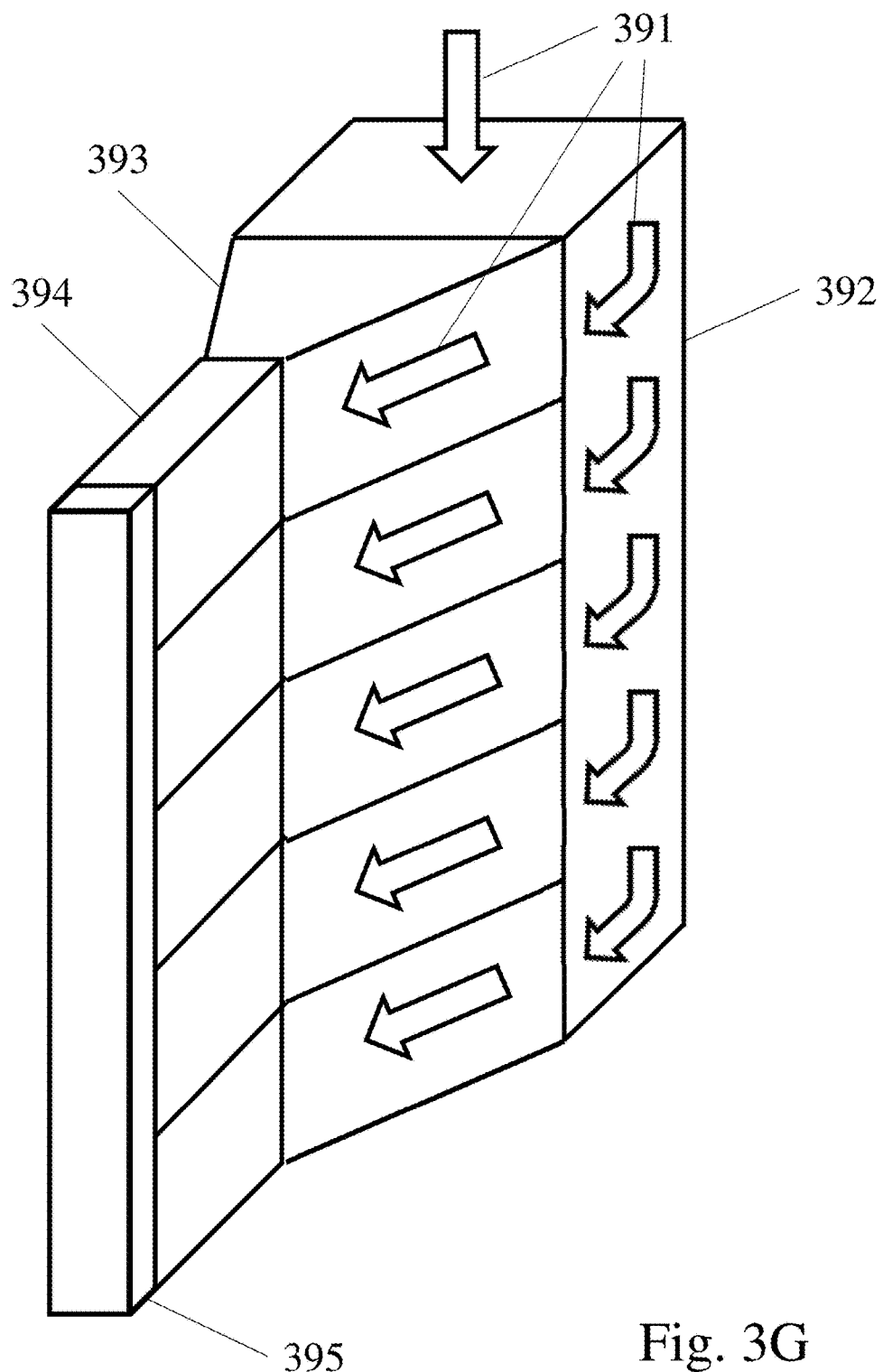
FIGS. 3G-3H are simplified diagrams of microwave chemical processing systems in which multiple field-enhancing waveguides are coupled to one microwave energy generator, in accordance with some embodiments.
Figure 3H:
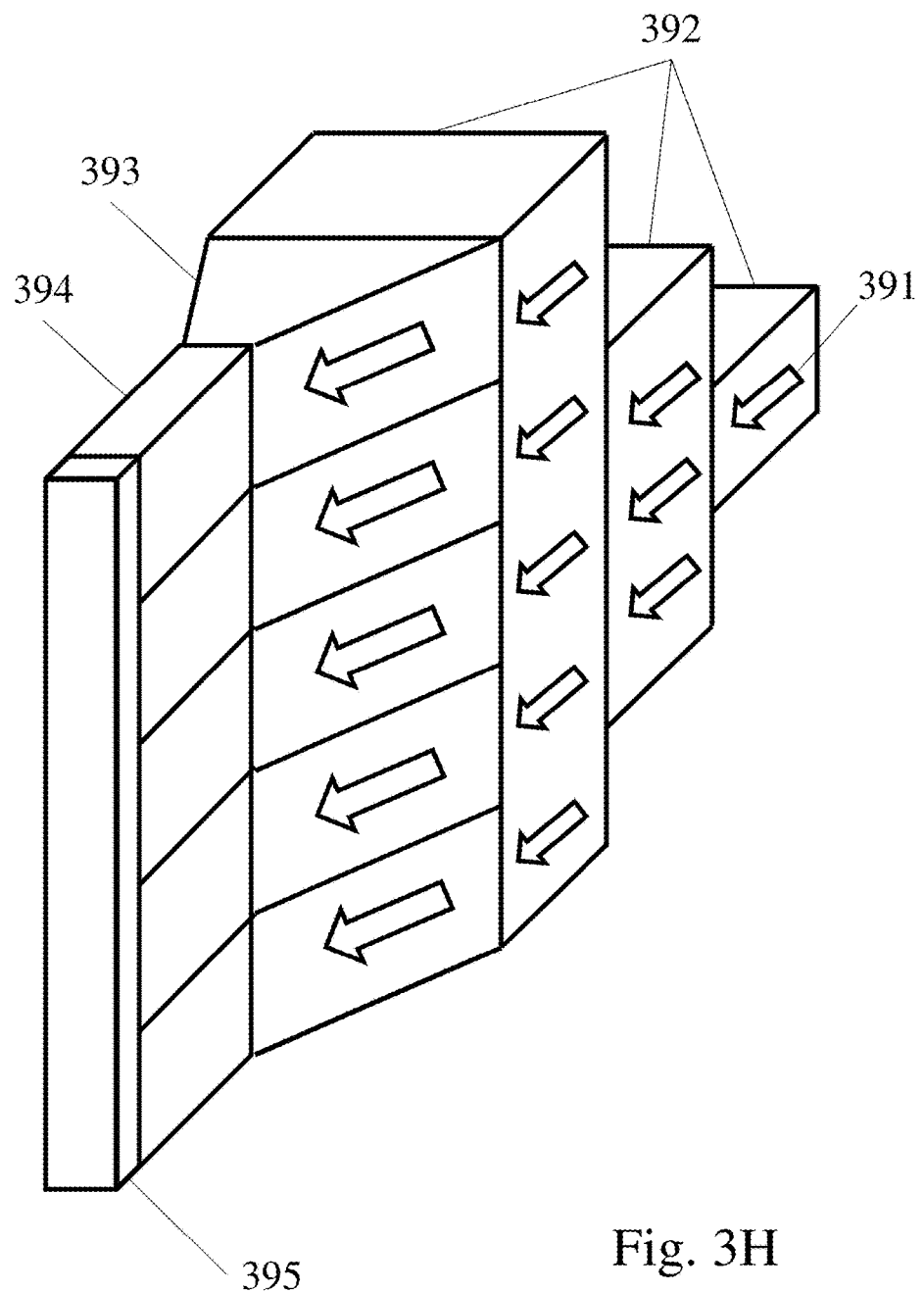

FIGS. 3G and 3H show embodiments of microwave chemical processing systems of the present disclosure, in which multiple FEWGs are coupled to one microwave energy generator (i.e., microwave energy sources) using different geometries. The FEWGs in these embodiments can share some or all of the features of the systems described above. The supply gas and process material inputs in these embodiments can also share some or all of the features described above. In some embodiments, each FEWG has a reaction zone. In some embodiments, a plasma is generated from a supply gas in a plasma zone in each of the FEWGs, and a reaction length of each of the FEWGs serve as reaction zones to separate the process material into separate components. In some embodiments, the reaction zones are connected together and the microwave chemical processing system has one outlet for the separated components. In some embodiments, the reaction zones are connected together and the microwave chemical processing system has more than one outlet for the separated components. In some embodiments, each reaction zone has its own outlet for the separated components.

FIG. 3G shows an embodiment with a manifold geometry where there is one microwave energy generator coupled to multiple FEWGs. The microwave energy 391 is coupled to a manifold waveguide 392, and then is coupled into multiple FEWGs. The microwave energy enters the large cross-sectional area section of each the FEWGs, then into the field-enhancing zone of the FEWGs 393, and is then coupled into the smaller cross-sectional area reaction zones of the FEWGs 394. In the embodiment depicted in FIG. 3G, all of the FEWGs are all connected together such that there is a single outlet 395 to collect the separated components.

FIG. 3H shows an embodiment with a network geometry where there is one microwave energy generator coupled to multiple FEWGs. The microwave energy 391 is coupled to a network waveguide 392, and then is coupled into multiple FEWGs. The specific network waveguide dimensions are dependent on the microwave frequency being used. The microwave energy enters the large cross-sectional area section of each the FEWGs, then into the field-enhancing zone of the FEWGs 393, and is then coupled into the smaller cross-sectional area reaction zones of the FEWGs 394. In the embodiment depicted in FIG. 3H, all of the FEWGs are all connected together such that there is a single outlet 395 to collect the separated components.

FIGS. 3G and 3H depict one microwave energy generator coupled to 5 FEWGs in a manifold or network geometry, but in some embodiments, there is one microwave energy generator coupled to fewer or greater than 5 FEWGs in a manifold or network geometry. In some embodiments, the microwave energy from more than one microwave generator can be combined using a power combiner, and then the combined microwave energy can be coupled into more than one FEWG in a manifold or network geometry. The microwave energy emitted from such a power combiner can be very large, and can be coupled into many FEWGs (e.g., more than 10) in a manifold or network geometry. In some embodiments, there are from 1 to 10 FEWGs coupled to each microwave energy generator in a manifold or network geometry. FIGS. 3G and 3H depict one outlet, but there can be more than one outlet from FEWGs coupled to microwave energy generators in a manifold or network geometry. In some embodiments, there are from 1 to 10 outlets to collect the separated components from FEWGs coupled to microwave energy generators in a manifold or network geometry. FIGS. 3G and 3H depict one microwave energy generator coupled to multiple FEWGs, but in some embodiments, there is from 1 to 10 microwave energy generators coupled to from 1 to 10 FEWGs in a manifold or network geometry. In some embodiments, there are from 1 to 10 FEWGs connected together into each outlet to collect the separated components from FEWGs coupled to microwave energy generators in a manifold or network geometry.

In some embodiments, there are apertures between the manifold or network geometry waveguides 392 and the field-enhancing zones of the FEWGs 393. The dimensions of these apertures are tailored to effectively couple the microwave energy from the manifold or network geometry waveguides 392 to the field-enhancing zones of the FEWGs 393. In some embodiments, the dimensions of these apertures are different sizes to balance the microwave energy transmission from the manifold or network geometry waveguides 392 between all of the coupled field-enhancing zones of the FEWGs 393.

In some embodiments, the dimensions of the manifold or network geometry waveguides 392 are tailored such that they form a resonant cavity and there is (are) standing wave(s) of microwave energy within the manifold or network geometry waveguides 392. In some embodiments, the standing wave of microwave energy is tuned to effectively couple microwave energy into each of the coupled field-enhancing zones of the FEWGs 393.

In some embodiments, there is controlled leakage from the manifold or network geometry waveguides 392 to the field-enhancing zones of the FEWGs 393 to effectively distribute the amount of microwave energy coupled into each of the reaction zones of the FEWG 394. Some examples of designs to control the leakage from the manifold or network geometry waveguides 392 to the field-enhancing zones of the FEWGs 393 and effectively distribute the amount of microwave energy coupled into each of the reaction zones of the FEWG 394 are: changing the cross-section and/or lengths of the waveguides; using apertures between the manifold or network geometry waveguides 392 and the field-enhancing zones of the FEWGs 393; changing the angle of orientation between the manifold or network geometry waveguides 392 and the field-enhancing zones of the FEWGs 393; using filaments, point sources, electrodes and/or magnets within the manifold or network geometry waveguides or within the FEWGs (as will be discussed in further detail below); and combinations of two or more of these design features.

Microwave Chemical Processing Methods

Figure 4A:
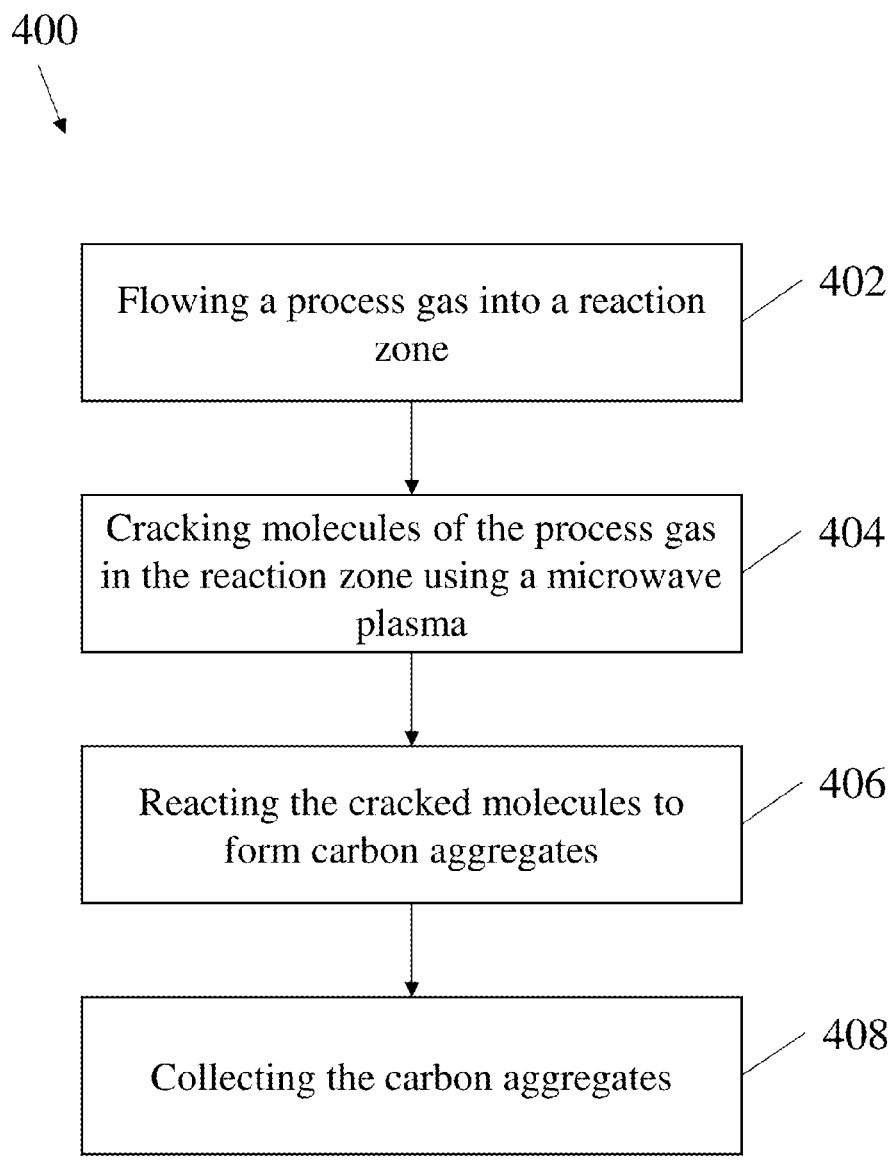
FIG. 4A is an example flow chart of methods for microwave processing of a gas in accordance with embodiments of the present disclosure.

A method for generating the carbon particles, nanoparticles, aggregates and materials described herein produced using microwave plasma reactors is shown in FIG. 4A. In some embodiments, the method 400 comprises step 402 of flowing a process gas into a reaction zone, step 404 of cracking molecules of the process gas in the reaction zone using a microwave plasma, step 406 of reacting the cracked molecules to form carbon aggregates, and step 408 of collecting the carbon aggregates. In some embodiments, the carbon aggregates comprise graphene. In some embodiments, the carbon aggregates comprise graphene, graphite, MWSFs, connected MWSFs, amorphous carbon, other carbon allotropes, or combinations thereof. In some embodiments, carbon aggregates contain a ratio of carbon to other elements, except hydrogen, greater than 99%, a median size of the carbon aggregates is from 1 to 50 microns, a surface area of the carbon aggregates is from 50 to 200 $m^2/g$, when measured using the Brunauer-Emmett-Teller (BET) method with nitrogen as the adsorbate, and the carbon aggregates, when compressed, have an electrical conductivity greater than 500 S/m.

Figure 4B:
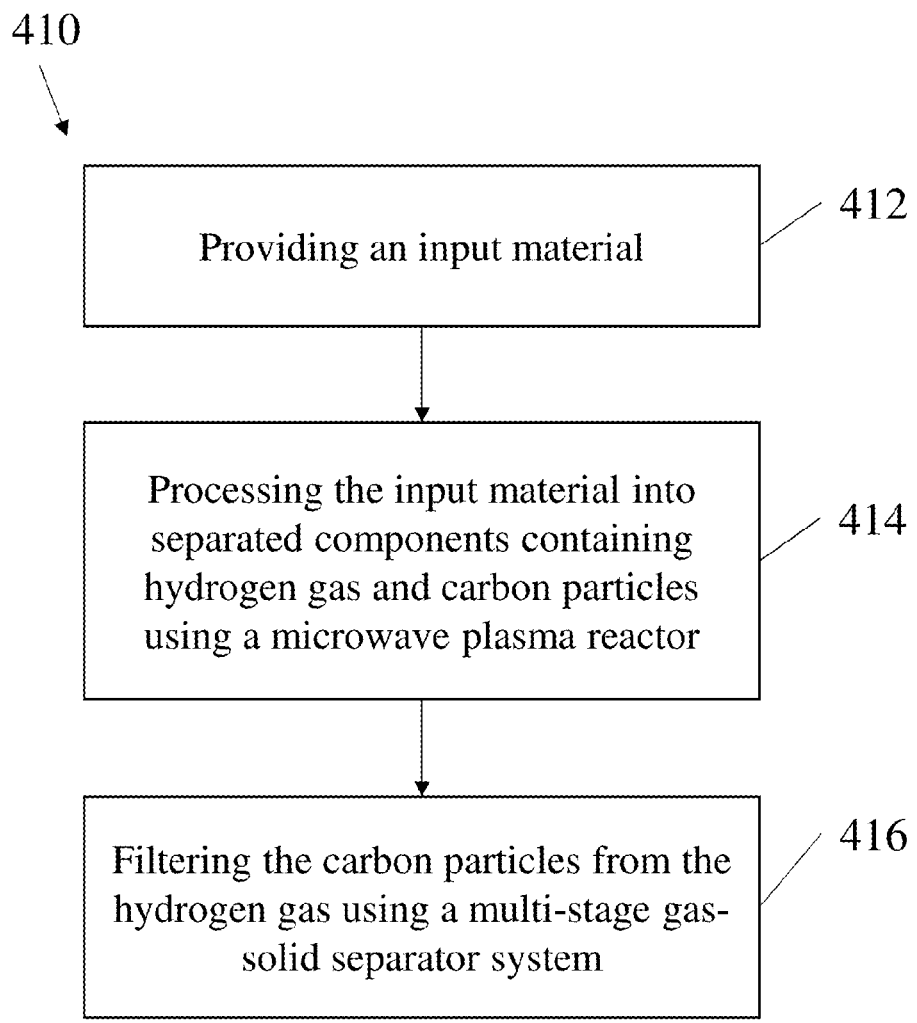
FIG. 4B is an example flow chart of methods for microwave processing of a gas in accordance with embodiments of the present disclosure.

A method for producing carbon particles described herein is shown in FIG. 4B. The method 410 includes step 412 of providing an input material comprising a hydrocarbon gas; step 414 of processing the input material into separate components using a microwave plasma reactor, wherein the separated components contain hydrogen gas and carbon particles; and step 416 of filtering the carbon particles from the hydrogen gas using a multi-stage gas-solid separator system. In some embodiments of the method 410, the multi-stage gas-solid separator system comprises: a first cyclone separator having an output; and a back-pulse filter system. The first cyclone separator filters the carbon particles from the separated components; and the back-pulse filter system filters the carbon particles from the output from the first cyclone separator.

In some embodiments of the methods, the temperature in the multi-stage gas-solid separator system is adjustable, and the temperature is adjusted to change the concentration of adsorbed hydrocarbons in the collected carbon particles.

In some embodiments of the methods, the temperature in the multi-stage gas-solid separator system is greater than 300° C., and a concentration of hydrocarbons of the collected carbon particles is from 1% to 5%.

In some embodiments of the methods, the input material comprises natural gas, and the flow rate of the input material into the reactor is greater than 5 slm. In some embodiments of the methods, the input material comprises bio-gas, and the flow rate of the input material into the reactor is greater than 5 slm.

In some embodiments of the methods, a majority of the carbon particles filtered by the cyclone separator are greater than 1 micron in size. In some embodiments of the methods, a majority of the carbon particles filtered by the back-pulse filter system are greater than 100 nm in size. In some embodiments of the methods, the greater than 80% of the carbon particles are filtered after the separated components are filtered by the first cyclone separator. In some embodiments of the methods, the greater than 99% of the carbon particles are filtered after the separated components are filtered by the first cyclone separator and the back-pulse filter system.

In some embodiments of the methods, the density of the carbon particles is less than 0.2 g/cm3. In some embodiments of the methods, the surface area of the carbon particles is from 50 to 300 m2/g, when measured via a Brunauer-Emmett-Teller (BET) method with nitrogen as the adsorbate.

In some embodiments of the methods, the carbon particles comprise graphene and one or more other carbon allotropes in addition to graphene. In some embodiments of the methods, the graphene comprises up to 15 layers; a ratio of carbon to other elements, except hydrogen, in the carbon particles is greater than 99%; and a ratio of the graphene to the other carbon allotropes is from 5% to 95%. In some embodiments of the methods, the carbon particles comprise amorphous carbon, and wherein the ratio of the graphene to the amorphous carbon is from 1% to 10%.

In some embodiments of the methods, the back-pulse filter system comprises: a plurality of back-pulse filters, each back-pulse filter having i) a filtering state in which the back-pulse filter is filtering the separated components, and ii) a cleaning state in which the back-pulse filter is being cleared using a flow of gas in the opposite direction from the flow of the separated components through the back-pulse filter; and a valve upstream of the plurality of back-pulse filters to switch each back-pulse filter between the filtering state and the cleaning state; wherein the plurality of back-pulse filters is arranged in parallel; and the process further comprises operating a first back-pulse filter of the plurality of back-pulse filters in the cleaning state while other back-pulse filters of the plurality of back-pulse filters are in the filtering state.

In some embodiments of the methods, the multi-stage gas-solid separator system further comprises a second cyclone separator between the first cyclone separator and the back-pulse filter system, wherein: the first cyclone separator filters out a first fraction of the carbon particles in the separated components, the second cyclone separator filters out a second fraction of carbon particles in the separated components, and the back-pulse filter system filters out a third fraction of carbon particles in the separated components. In some embodiments of the methods, the median particle size of the particles in the first fraction is larger than the median particle size of the particles in the second fraction, and the median particle size of the particles in the second fraction is larger than the median particle size of the particles in the third fraction.

In some embodiments of the methods, the microwave plasma reactor comprises: a pressure from 0.1 atm to 10 atm; and a microwave energy plasma source with a frequency from 915 MHz to 5.8 GHz.

EXAMPLES

Example 1: Microwave Chemical Processing System Gas-Solid Separation System

In this first example, carbon particles and aggregates containing graphite and graphene were generated using a microwave plasma reactor system, described in embodiments above. The microwave plasma reactor in this example had a main body made from stainless steel with a quartz inner wall material. However, the quartz inner wall material is not needed in all cases, and similar carbon materials can be produced in reactors not containing quartz in or adjacent to the reaction zone. The reaction zone volume was approximately 45 cm$^3$. The precursor material was methane, and was optionally mixed with a supply gas (e.g., argon). The flow rate of methane was from 1 to 100 L/min, and the flow rate of the supply gas was from 0 to 100 L/min. With those flow rates and the tool geometry, the residence time of the gas in the reaction chamber was from approximately 0.001 second to approximately 2.0 seconds, and the carbon particle production rate was from approximately 0.1 g/hr to approximately 15 g/hr.

In this example, a hydrocarbon was the input material for the microwave plasma reactor, and separated components were hydrogen gas and carbon particles containing graphite and graphene. The carbon particles were separated from the hydrogen gas in a multi-stage gas-solid separation system. After exiting the microwave plasma reactor, the hydrogen gas and carbon particles were processed through a cyclone separator first stage, and the output from the cyclone separator was then processed through a back-pulse filter second stage.

The cyclone separator used in the gas-solid separation system in this example was composed of stainless steel, had a 1" OD tube at the inlet and outlet, and had a length of approximately 13.25", and a diameter of approximately 2.5". The temperature of the cyclone separator during the separation experiment was greater than 225° C., and the pressure was from 0 to 100 psig.

The back-pulse filter used in the gas-solid separation system in this example included a porous stainless steel filter element with median size from 0.5 μm to 25 μm. The temperature of the back-pulse filter during the filtration experiment was greater than 250° C. The minimum pressure drop across the filter was greater than 0.5 psig, and the maximum pressure drop was approximately 15 psig. The pressure on the reactor side of the filter (i.e., the upstream side during filtration) was greater than 1 psig, and the pressure on the outlet side (i.e., the downstream side during filtration) was approximately 0.5 psig less than the pressure inside the microwave plasma reactor.

The particles produced in this example contained graphite and graphene, and no seed particles. The particles in this example had a ratio of carbon to other elements (other than hydrogen) of approximately 99.5% or greater. The solids loading of the separated components from the reactor was from 0.001 g/L to 2.5 g/L.

The gas-solid separation system in this example, including the cyclone separator first stage followed by the back-pulse filter second stage, removed more than 99% of the carbon particles from the hydrogen gas in the separated components.

Figure 5A:
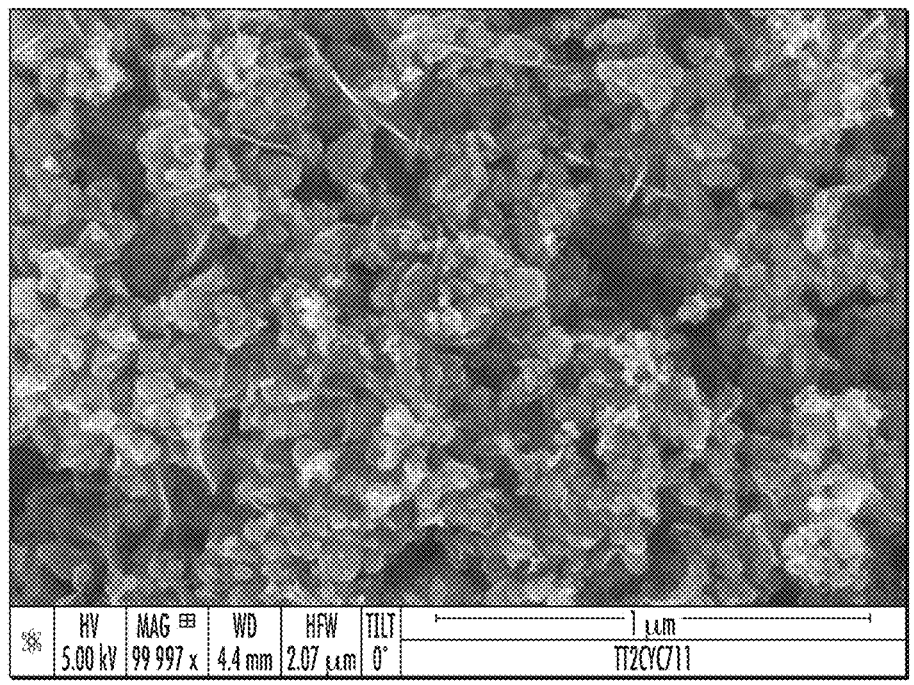
FIGS. 5A and 5B show scanning electron microscope (SEM) images from as-synthesized carbon aggregates containing graphite and graphene in a first example, in accordance with some embodiments.
Figure 5B:
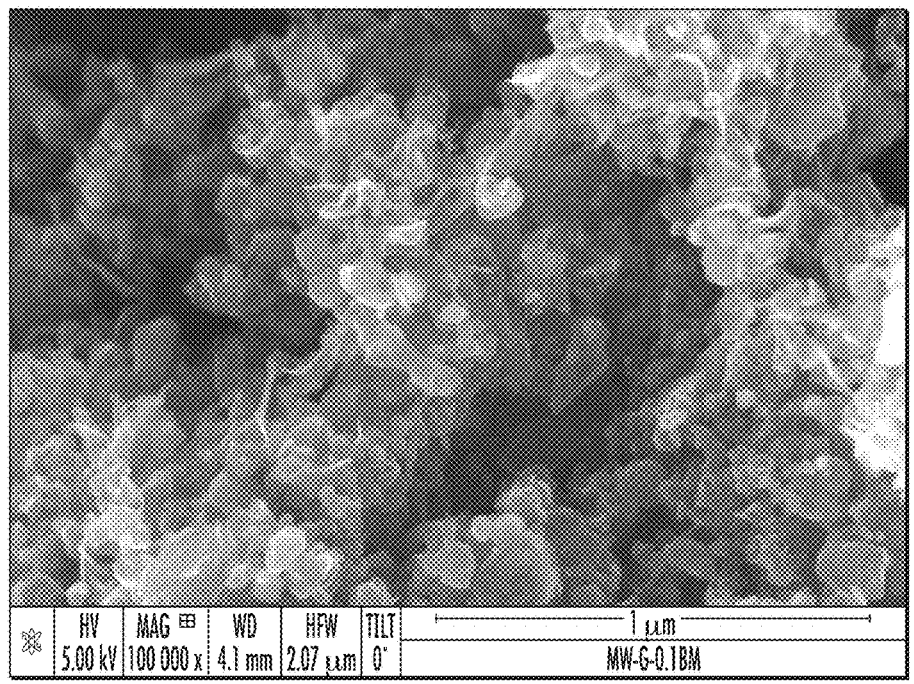

FIG. 5A shows an SEM image of carbon aggregates of this example, captured by the cyclone separator, showing the graphite and graphene allotropes. FIG. 5B shows an SEM image, of carbon aggregates of this example captured by the back-pulse filter, showing the graphite and graphene allotropes. The layered graphene is clearly shown within the distortion (wrinkles) of the carbon. The 3D structure of the carbon allotropes is also visible.

Figure 5C:
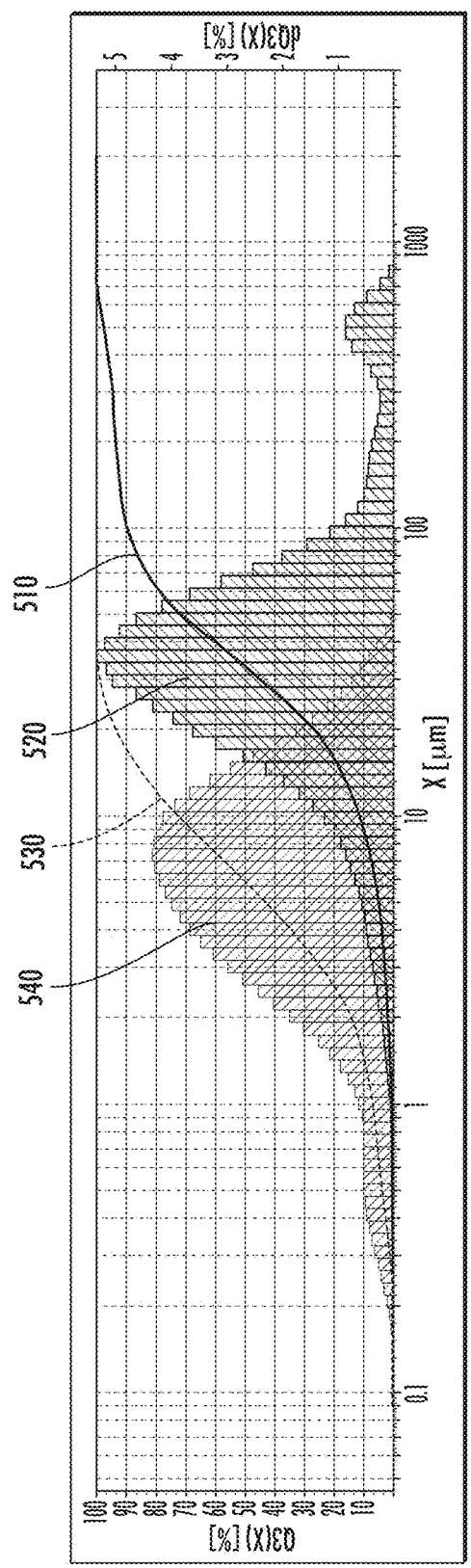
FIGS. 5C and 5D show particle size distributions of collected carbon particles in a first example, in accordance with some embodiments.

The particle size distribution of the carbon particles captured in the cyclone separator first stage in this example is shown in FIG. 5C. The mass basis cumulative particle size distribution 510 corresponds to the left y-axis in the graph (Q3(x) [%]). The histogram of the mass particle size distribution 520 corresponds to the right axis in the graph (dQ3(x) [%]). The median particle size captured in the cyclone separator in this example was approximately 33 μm, the 10$^{th}$ percentile particle size was approximately 9 μm, and the 90$^{th}$ percentile particle size was approximately 103 μm. The mass density of the particles collected in the cyclone separator was approximately 10 g/L.

Figure 5D:
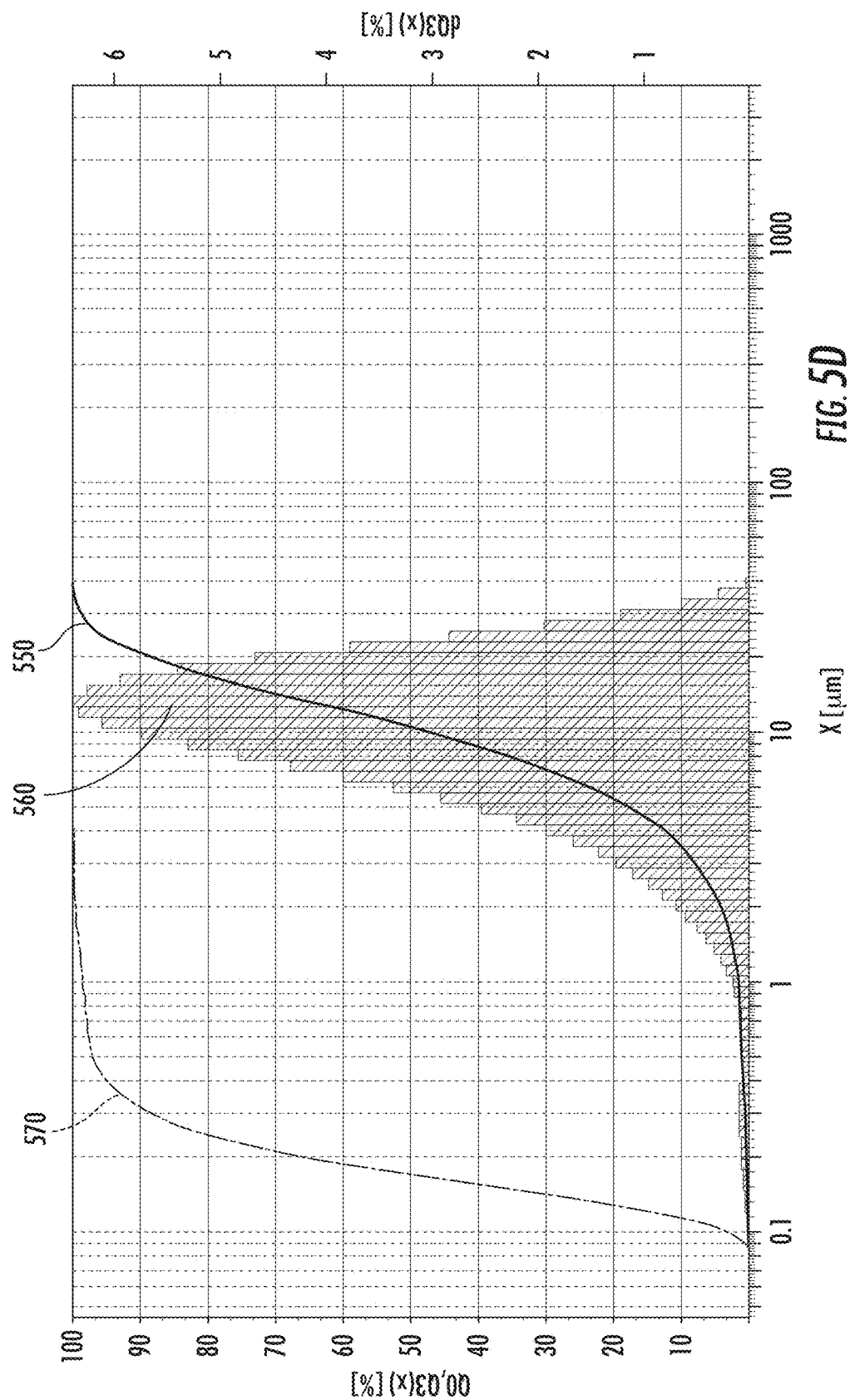

The particle size distribution of the carbon particles captured in the back-pulse filter second stage in this example is shown in FIG. 5D. The mass basis cumulative particle size distribution 550 corresponds to the left y-axis in the graph (Q3(x) [%]). The histogram of the mass particle size distribution 560 corresponds to the right axis in the graph (dQ3(x) [%]). The median particle size captured in the cyclone separator in this example was approximately 11 μm, the 10$^{th}$ percentile particle size was approximately 3.5 μm, and the 90$^{th}$ percentile particle size was approximately 21 μm. The graph in FIG. 5D also shows the number basis cumulative particle size distribution 570 corresponding to the left y-axis in the graph (Q0(x) [%]). The median particle size by number basis in this example was from approximately 0.1

μm to approximately 0.2 μm. The mass density of the particles collected in the back-pulse filter was approximately 22 g/L.

FIG. 5C also shows the results from a second experiment of this first Example. The particles produced in the microwave plasma reactor of this example were sized-reduced by mechanical grinding, and then the size-reduced particles were processed using the cyclone separator of this example. The mass basis cumulative particle size distribution 530 of the size-reduced carbon particles captured in the cyclone separator in this example corresponds to the left y-axis in the graph (Q3(x) [%]). The histogram of the mass basis particle size distribution 540 corresponds to the right axis in the graph (dQ3(x) [%]). The median particle size of the size-reduced carbon particles captured in the cyclone separator in this example was approximately 6 μm, the $10^{th}$ percentile particle size was from 1 μm to 2 μm, and the $90^{th}$ percentile particle size was from 10 μm to 20 μm.

Example 2: Microwave Chemical Processing System Gas-Solid Separation System

In this second example, carbon particles and aggregates containing graphite, graphene and amorphous carbon were generated using a microwave plasma reactor system as described in Example 1. The precursor material contained methane, or isopropyl alcohol (IPA), or ethanol, or a condensed hydrocarbon (e.g., hexane). The carbon-containing precursors were optionally mixed with a supply gas (e.g., argon). When gaseous methane was used, the flow rate of methane was from 1 to 100 L/min, and the flow rate of the supply gas was from 0 to 100 L/min. When the precursor material was a liquid mixture of IPA and ethanol, the flow rate of the liquid mixture was from 0.1 to 100 mL/min. In some other cases, a condensed hydrocarbon was used and the flow rate of the hydrocarbon was approximately 3 L/min. With those flow rates and the tool geometry, the residence time of the gas in the reaction chamber was from approximately 0.001 second to approximately 2.0 seconds, and the carbon particle production rate was from approximately 0.1 g/hr to approximately 15 g/hr. After the aggregates were synthesized and collected, they were post-processed by annealing at a temperature from 1000 to 2200° C. in an inert atmosphere for a duration of approximately 60 to approximately 600 minutes.

The particles produced in this example contained graphite, graphene, amorphous carbon and no seed particles. The particles in this example had a ratio of carbon to other elements (other than hydrogen) of approximately 99.5% or greater.

In this example, a hydrocarbon was the input material for the microwave plasma reactor, and separated components were hydrogen gas and carbon particles containing graphite, graphene and amorphous carbon. The carbon particles were separated from the hydrogen gas in a multi-stage gas-solid separation system as described in Example 1. The solids loading of the separated components from the reactor was from 0.001 g/L to 2.5 g/L.

Figure 6A:
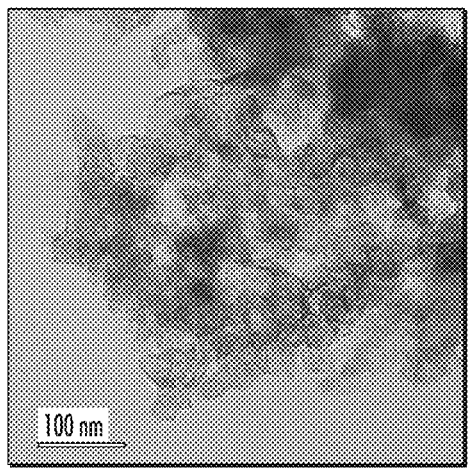
FIGS. 6A-6C show TEM images from as-synthesized carbon aggregates containing graphite, graphene and amorphous carbon in a second example, in accordance with some embodiments.
Figure 6B:
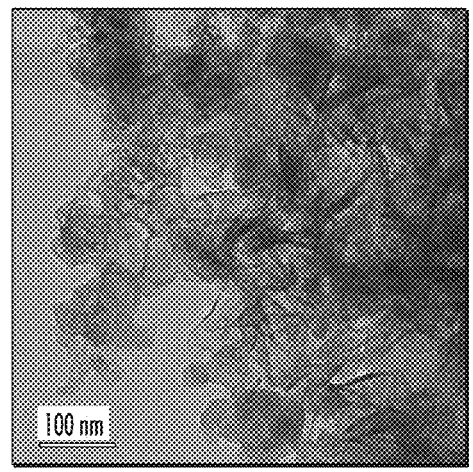
Figure 6C:
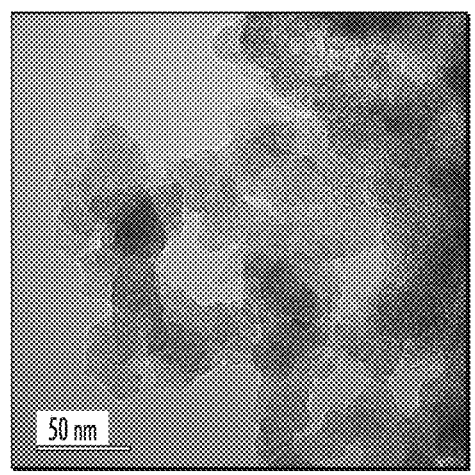

FIGS. 6A-6C show TEM images of as-synthesized carbon nanoparticles of this example showing the graphite, graphene and amorphous carbon allotropes. The layers of graphene and other carbon materials can be clearly seen in the images.

Figure 6D:
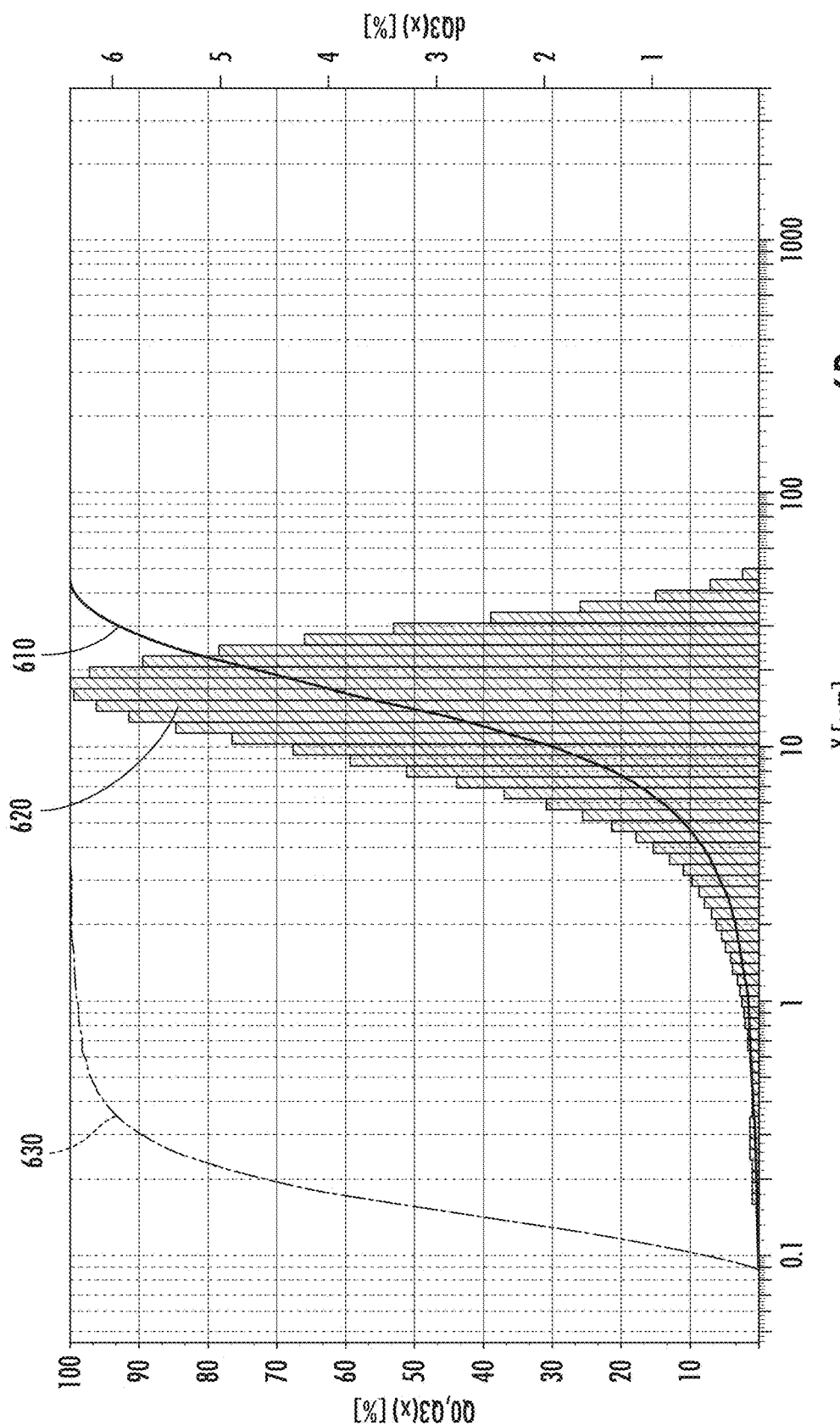
FIG. 6D shows particle size distributions of collected carbon particles in a second example, in accordance with some embodiments.

The particle size distribution of the carbon particles captured in the cyclone separator first stage in this example is shown in FIG. 6D. The mass basis cumulative particle size distribution 610 corresponds to the left y-axis in the graph (Q3(x) [%]). The histogram of the mass particle size distribution 620 corresponds to the right axis in the graph (dQ3(x) [%]). The median particle size captured in the cyclone separator in this example was approximately 14 μm, the $10^{th}$ percentile particle size was approximately 5 μm, and the $90^{th}$ percentile particle size was approximately 28 μm. The graph in FIG. 6D also shows the number basis cumulative particle size distribution 630 corresponding to the left y-axis in the graph (Q0(x) [%]). The median particle size by number basis in this example was from approximately 0.1 μm to approximately 0.2 μm.

Reference has been made in detail to embodiments of the disclosed invention, one or more examples of which have been illustrated in the accompanying figures. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:
1. A materials processing system, comprising:
an input material comprising a hydrocarbon gas;
a microwave plasma reactor comprising:
    a microwave energy source;
    a field-enhancing waveguide coupled to the microwave energy source, the field-enhancing waveguide having a first cross-sectional area and a second cross-sectional area, wherein the field-enhancing waveguide includes a field-enhancing zone between the first cross-sectional area and the second cross-sectional area, a plasma zone, and a reaction zone, and wherein the second cross-sectional area:
        is smaller than the first cross-sectional area, and the field-enhancing zone has a decreasing cross-sectional area from the first cross-sectional area to the second cross-sectional area;
        is farther away from the microwave energy source than the first cross-sectional area; and
        extends along a reaction length that forms the reaction zone of the field-enhancing waveguide, wherein the microwave energy propagates in a direction along the reaction length; and
    an inlet configured to receive the input material, wherein the input material flows through the inlet into the reaction zone;
    wherein the plasma separates the input material into separated components, the separated components comprising hydrogen gas and carbon particles;
a multi-stage gas-solid separator system coupled to the microwave plasma reactor, the multi-stage gas-solid separator system comprising:

a first cyclone separator having an output, wherein the first cyclone separator filters the carbon particles from the separated components; and
a back-pulse filter system coupled to the output of the first cyclone separator, wherein the back-pulse filter system filters the carbon particles from the output from the first cyclone separator.

2. The system of claim 1, wherein the input material comprises natural gas, and the flow rate of the input material into the reactor is greater than 5 slm.

3. The system of claim 1, wherein the input material comprises bio-gas, and the flow rate of the input material into the reactor is greater than 5 slm.

4. The system of claim 1, wherein the first cyclone separator and back-pulse filter system are heated to a temperature greater than 300° C.

5. The system of claim 1, wherein a majority of the carbon particles filtered by the first cyclone separator are greater than 1 micron in size.

6. The system of claim 1, wherein a majority of the carbon particles filtered by the back-pulse filter system are greater than 100 nm in size.

7. The system of claim 1, wherein greater than 80% of the carbon particles are filtered by the first cyclone separator.

8. The system of claim 1, wherein greater than 99% of the carbon particles are filtered after the separated components are filtered by the first cyclone separator and the back-pulse filter system.

9. The system of claim 1, wherein the density of the carbon particles in the separated components produced by the microwave plasma reactor is less than 0.2 g/cm$^3$.

10. The system of claim 1, wherein the carbon particles comprise graphene and one or more other carbon allotropes in addition to graphene, wherein:
the graphene comprises up to 15 layers;
a ratio of carbon to other elements, except hydrogen, in the carbon particles is greater than 99%; and
a ratio of the graphene to the other carbon allotropes is greater than 5%.

11. The system of claim 1, wherein the back-pulse filter system comprises:
a plurality of back-pulse filters, each back-pulse filter having i) a filtering state in which the back-pulse filter is filtering the separated components, and ii) a cleaning state in which the back-pulse filter is being cleared using a flow of gas through the back-pulse filter; and
a valve upstream of the plurality of back-pulse filters to switch each back-pulse filter between the filtering state and the cleaning state;
wherein the plurality of back-pulse filters is arranged in parallel such that a first back-pulse filter of the plurality of back-pulse filters can be in the cleaning state while other back-pulse filters of the plurality of back-pulse filters are in the filtering state.

12. The system of claim 1, wherein the multi-stage gas-solid separator system further comprises a second cyclone separator between the first cyclone separator and the back-pulse filter system, wherein:
the first cyclone separator filters out a first fraction of the carbon particles in the separated components,
the second cyclone separator filters out a second fraction of carbon particles in the separated components, and
the back-pulse filter system filters out a third fraction of carbon particles in the separated components.

13. The system of claim 12, wherein the median particle size of the particles in the first fraction is larger than the median particle size of the particles in the second fraction, and the median particle size of the particles in the second fraction is larger than the median particle size of the particles in the third fraction.

14. A process for producing carbon particles, comprising:
supplying pulsed microwave radiation through a waveguide having a length, the microwave radiation propagating in a direction along the waveguide;
providing a supply gas into the waveguide at a first location along the length of the waveguide, a majority of the supply gas flowing in the direction of the microwave radiation propagation;
generating a plasma in the supply gas in at least a portion of the length of the waveguide;
providing an input material into the waveguide at a second location downstream from the first location, a majority of the process gas flowing in the direction of the microwave propagation, wherein the input material comprises a hydrocarbon gas;
controlling an average energy of the plasma to convert the input material into separated components, wherein the separated components contain hydrogen gas and carbon particles; and
filtering the carbon particles from the hydrogen gas using a multi-stage gas-solid separator system, wherein the multi-stage gas-solid separator system comprises:
a first cyclone separator having an output; and
a back-pulse filter system, wherein:
the first cyclone separator filters the carbon particles from the separated components; and
the back-pulse filter system filters the carbon particles from the output from the first cyclone separator.

15. The process of claim 14, wherein a temperature in the multi-stage gas-solid separator system is adjustable, and the temperature is adjusted to change the concentration of adsorbed hydrocarbons in the collected carbon particles.

16. The process of claim 14, wherein the input material comprises natural gas, and the flow rate of the input material into the reactor is greater than 5 slm.

17. The process of claim 14, wherein the input material comprises bio-gas, and the flow rate of the input material into the reactor is greater than 5 slm.

18. The process of claim 14, wherein the density of the carbon particles is less than 0.2 g/cm$^3$.

19. The process of claim 14, wherein the carbon particles comprise graphene and one or more other carbon allotropes in addition to graphene, wherein:
the graphene comprises up to 15 layers;
a ratio of carbon to other elements, except hydrogen, in the carbon particles is greater than 99%; and
a ratio of the graphene to the other carbon allotropes is greater than 5%.

20. The process of claim 14, wherein:
the back-pulse filter system comprises:
a plurality of back-pulse filters, each back-pulse filter having i) a filtering state in which the back-pulse filter is filtering the separated components, and ii) a cleaning state in which the back-pulse filter is being cleared using a flow of gas in the opposite direction from the flow of the separated components through the back-pulse filter; and
a valve upstream of the plurality of back-pulse filters to switch each back-pulse filter between the filtering state and the cleaning state;
wherein the plurality of back-pulse filters is arranged in parallel; and the process further comprises operating a first back-pulse filter of the plurality of back-pulse filters in the cleaning state while other back-pulse filters of the plurality of back-pulse filters are in the filtering state.

* * * * *